(12) United States Patent
Kazama

(10) Patent No.: US 8,575,627 B2
(45) Date of Patent: *Nov. 5, 2013

(54) SEMICONDUCTOR LIGHT EMITTING ELEMENT HAVING BARRIERS WHICH PREVENT FORWARD CURRENT IN A SEMICONDUCTOR FILM THEREOF

(75) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/567,202

(22) Filed: Aug. 6, 2012

(65) Prior Publication Data

US 2013/0037839 A1    Feb. 14, 2013

(30) Foreign Application Priority Data

Aug. 9, 2011   (JP) ................................ 2011-173692

(51) Int. Cl.
| | |
|---|---|
| *H01L 27/15* | (2006.01) |
| *H01L 29/161* | (2006.01) |
| *H01L 31/12* | (2006.01) |
| *H01L 31/153* | (2006.01) |
| *H01L 33/00* | (2010.01) |

(52) U.S. Cl.
USPC ............. 257/84; 257/13; 257/81; 257/98; 257/99; 257/88; 438/28; 438/29; 438/69; 438/597; 438/571

(58) Field of Classification Search
USPC .............. 257/E21.351, E21.064, E21.047, 257/E21.046, E29.148, E29.143, 13, 21, 257/22, 79, 80, 81, 82, 84, 85, 86, 94, 96, 257/98, 99, 103, 918, 40, 91, 88; 438/FOR. 453, FOR. 173, FOR. 335, 22, 438/28, 29, 27, 34, 46, 47, 69, 72, 586, 597, 438/598, 570, 571, 533, 534
See application file for complete search history.

(56) References Cited

U.S. PATENT DOCUMENTS

| | | | |
|---|---|---|---|
| 2009/0072257 A1 | 3/2009 | Unno et al. | |
| 2010/0207146 A1 | 8/2010 | Iizuka et al. | |
| 2012/0305889 A1 | 12/2012 | Lim et al. | |
| 2013/0020552 A1* | 1/2013 | Kazama | ................... 257/13 |

FOREIGN PATENT DOCUMENTS

| | | |
|---|---|---|
| JP | 2007-227895 A | 9/2007 |
| JP | 2008-060331 A | 3/2008 |
| JP | 2010-192709 A | 9/2010 |

* cited by examiner

*Primary Examiner* — Thanh Y Tran
(74) *Attorney, Agent, or Firm* — Holtz, Holtz, Goodman & Chick, PC

(57) ABSTRACT

A semiconductor light emitting element of the present invention includes a support substrate, a semiconductor film including a light emitting layer, a surface electrode provided on the surface on a light-extraction-surface side of the semiconductor film, and a light reflecting layer. The surface electrode includes first electrode pieces that form ohmic contact with the semiconductor film and a second electrode piece electrically connected to the first electrode pieces. The light reflecting layer includes a reflecting electrode, and the reflecting electrode includes third electrode pieces that form ohmic contact with the semiconductor film and a fourth electrode piece electrically connected to the third electrode pieces and placed opposite to the second electrode piece. Both the second electrode piece and the fourth electrode piece form Schottky contact with the semiconductor film so as to form barriers to prevent forward current in the semiconductor film.

18 Claims, 11 Drawing Sheets

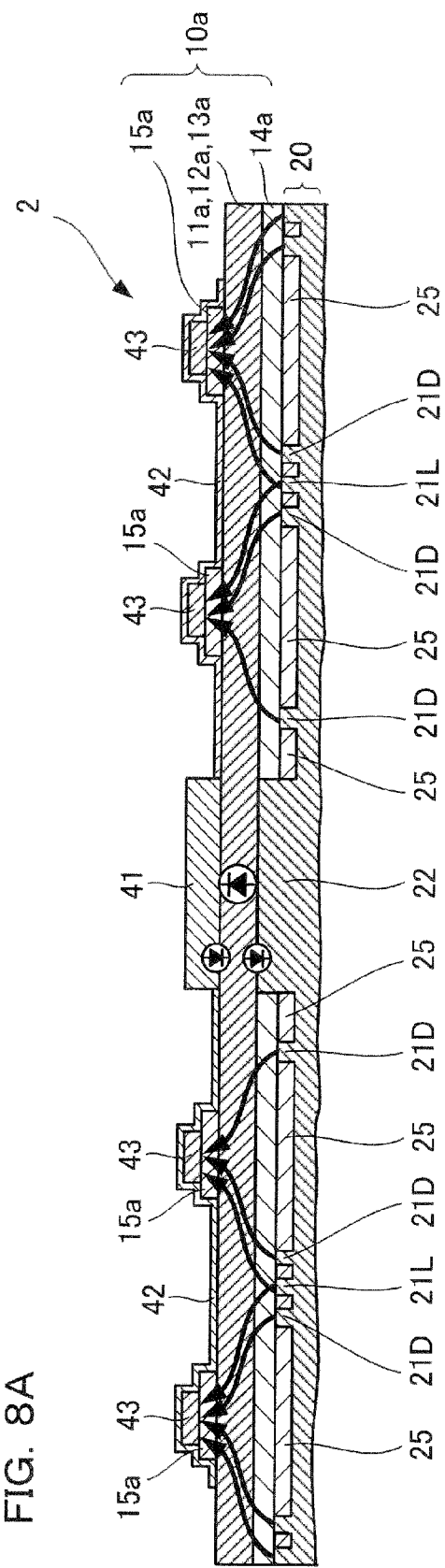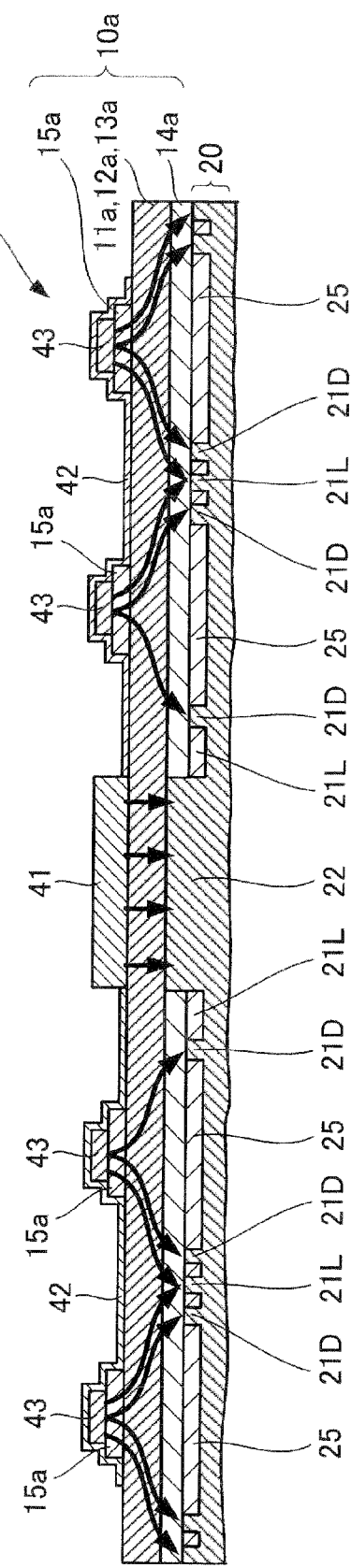

SEMICONDUCTOR LIGHT EMITTING ELEMENT HAVING BARRIERS WHICH PREVENT FORWARD CURRENT IN A SEMICONDUCTOR FILM THEREOF

BACKGROUND OF THE INVENTION

1. Field of the Invention

The present invention relates to a semiconductor light emitting element such as an LED (light emitting diode).

2. Description of the Related Art

As to LEDs formed of AlGaInP-based material, the band gap of the light emitting layer is larger than the band gap of a GaAs substrate used in crystal-growth. Hence, part of light directed toward the light-extraction-surface side out of the light emitted from the light emitting layer can be extracted, but light directed to the GaAs-substrate side is then absorbed by the GaAs substrate. As an element structure to solve this problem, there is known a so-called stuck-together structure where a light reflecting film is formed on a surface opposite the light extraction surface of the semiconductor film. This light emitting element is produced by, for example, forming the semiconductor film made of AlGaInP-based material on a GaAs substrate and then providing a light reflecting film made of a metal of high reflectance on the surface of the semiconductor film and sticking a support substrate onto the light reflecting film and then removing the GaAs substrate. In an LED of this configuration, light directed toward the opposite side from the light extraction surface is reflected by the light reflecting film and emitted outside, and thus the light extraction efficiency of the LED is improved.

Meanwhile, light incident at an angle greater than or equal to the critical angle relative to the interface between the semiconductor film and the ambient medium such as air or resin is totally reflected and thus cannot be extracted outside. Light which cannot be extracted outside is repeatedly reflected inside the semiconductor film and attenuated. The intensity of light propagating inside the semiconductor film decreases exponentially with the propagation distance (optical path length). For example, if an AlGaInP-based semiconductor film having a refractive index of 3.3 is encapsulated in resin having a refractive index of 1.5, then the critical angle is 27°, and the reflectance at the interface between the semiconductor film and the resin is about 15%. Thus, the proportion of light which can be extracted outside is limited to about 4.5%.

Accordingly, there is known a light extracting structure formed by making the light extraction surface of the semiconductor film rough. With this structure, light directed to the light extraction surface is then scattered and diffracted by protrusions/hollows in the surface of the semiconductor film, thereby reducing the amount of light totally reflected at the interface between the light extraction surface and the ambient medium, and thus the light extraction efficiency can be improved.

Further, among so-called vertical light emitting elements where with an electrode being provided on each of the upper and lower surfaces of the semiconductor film, a current is made to flow in the thickness direction of the semiconductor film, there exists a known light emitting element where the electrode on the upper surface side and the electrode on the lower surface side are placed so as not to overlap each other when they are projected onto a plane parallel to the principal surface of the semiconductor film (that is, the surface perpendicular to the laminating direction of the semiconductor film). This electrode configuration is referred to as counter-electrodes. With this electrode configuration, current spread in directions in the principal surface of the semiconductor film is promoted, so that the uniformity of the current density distribution and the light emission brightness distribution can be improved. Note that the counter-electrodes are usually used in combination with the above stuck-together structure.

Examples of the prior art are as follows:

Japanese Patent Kokai No. 2007-227895 (Patent Literature 1),

Japanese Patent Kokai No. 2008-60331 (Patent Literature 2), and

Japanese Patent Kokai No. 2010-192709 (Patent Literature 3).

SUMMARY OF THE INVENTION

In a semiconductor light emitting element having the stuck-together structure as described above, the thickness of the semiconductor film is usually as thin as 20 µm or less, and thus current constriction is likely to occur, especially resulting in low electrostatic-breakdown resistance to reverse surges. Further, when a light extracting structure such as a photonic crystal is formed by, for example, etching the surface of the semiconductor film, the thickness of the semiconductor film contributing to current spread becomes further smaller, and hence the electrostatic-breakdown resistance is further reduced. By adopting the counter-electrode arrangement, current spread inside the semiconductor film tends to be promoted, thus improving the electrostatic-breakdown resistance, but the effect is not sufficient.

As an effective means for improving the electrostatic-breakdown resistance, there is cited an electrode configuration with which the local constriction of current can be avoided when a surge is applied. In this case, it is important to suppress a reduction in the luminous efficiency and a reduction in the light output as much as possible. For example, with a larger covering rate of a surface electrode formed on the light extraction surface, a reduction in the light output cannot be avoided. Further, light generated immediately under a feed pad (bonding pad) connected by a bonding wire is blocked by the feed pad and difficult to extract outside. Hence, if a current flows in immediately under the feed pad so that light is generated immediately under the feed pad, the light extraction efficiency is reduced. It is desirable to improve the electrostatic-breakdown resistance without a reduction in the light output and a reduction in the light extraction efficiency as mentioned above.

The present invention has been made in view of the above points, and an object thereof is to provide a semiconductor light emitting element which can improve the electrostatic-breakdown resistance with avoiding a reduction in the efficiency and a reduction in the light output at the time of light emitting operation.

According to the present invention, there is provided a semiconductor light emitting element including a support substrate, a semiconductor film including a light emitting layer and provided over the support substrate, a surface electrode provided on the surface on a light-extraction-surface side of the semiconductor film, and a light reflecting layer provided between the support substrate and the semiconductor film, which layer forms a light reflecting surface at the surface in contact with the semiconductor film. The surface electrode includes first electrode pieces that form ohmic contact with the semiconductor film and a second electrode piece electrically connected to the first electrode pieces. The light reflecting layer includes a reflecting electrode, and the reflecting electrode includes third electrode pieces that form ohmic contact with the semiconductor film and a fourth electrode piece electrically connected to the third electrode pieces and placed opposite to the second electrode piece. The first electrode pieces and the third electrode pieces are placed so as not to overlap each other when they are projected onto a plane parallel to the principal surface of the semiconductor film. Both the second electrode piece and the fourth electrode piece form Schottky contact with the semiconductor film so as to form barriers to prevent forward current in the semiconductor film.

According to the semiconductor light emitting element of the present invention, at the time of light emitting operation, current is prevented from flowing into the area immediately under the feed pad, whereas, when a reverse voltage is applied, a current path is formed between the second electrode piece and the fourth electrode piece. Hence, with avoiding a reduction in the light extraction efficiency and a reduction in the light output at light emitting operation, it is possible to improve the breakdown resistance to reverse electrostatic surges.

BRIEF DESCRIPTION OF THE DRAWINGS

FIG. 8A is a cross-sectional view showing paths of current at the time of light emitting operation of the semiconductor light emitting element according to Embodiment 2 of the present invention;

FIG. 8B is a cross-sectional view showing paths of current when a reverse surge voltage is applied;

DETAILED DESCRIPTION OF THE INVENTION

Figure 1:
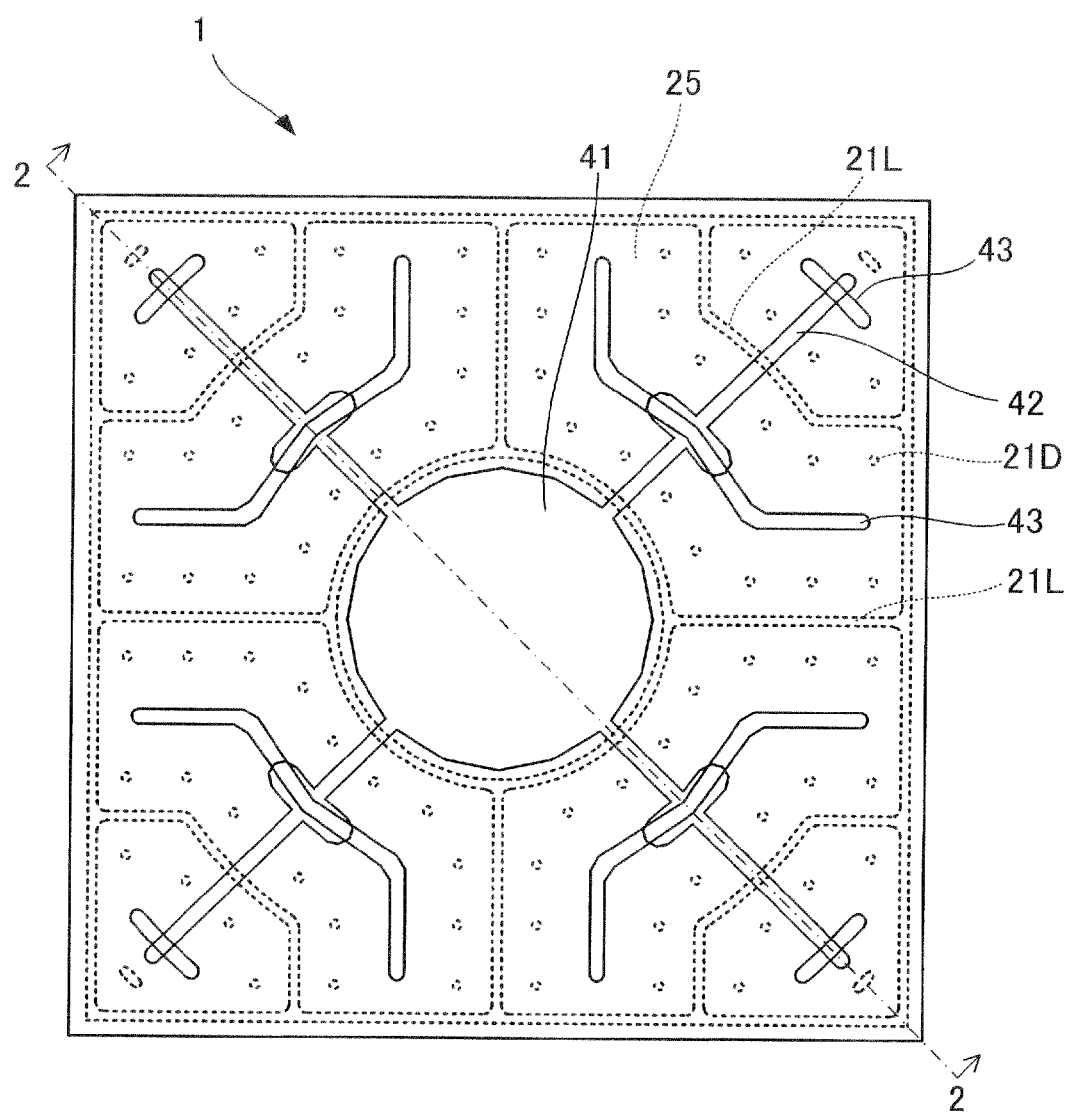
FIG. 1 is a plan view showing the configuration of a semiconductor light emitting element according to Embodiment 1 of the present invention.

Embodiments of the present invention will be described below with reference to the accompanying drawings. In the figures cited below, the same reference numerals are used to denote substantially the same or equivalent constituents or parts.

Figure 2:
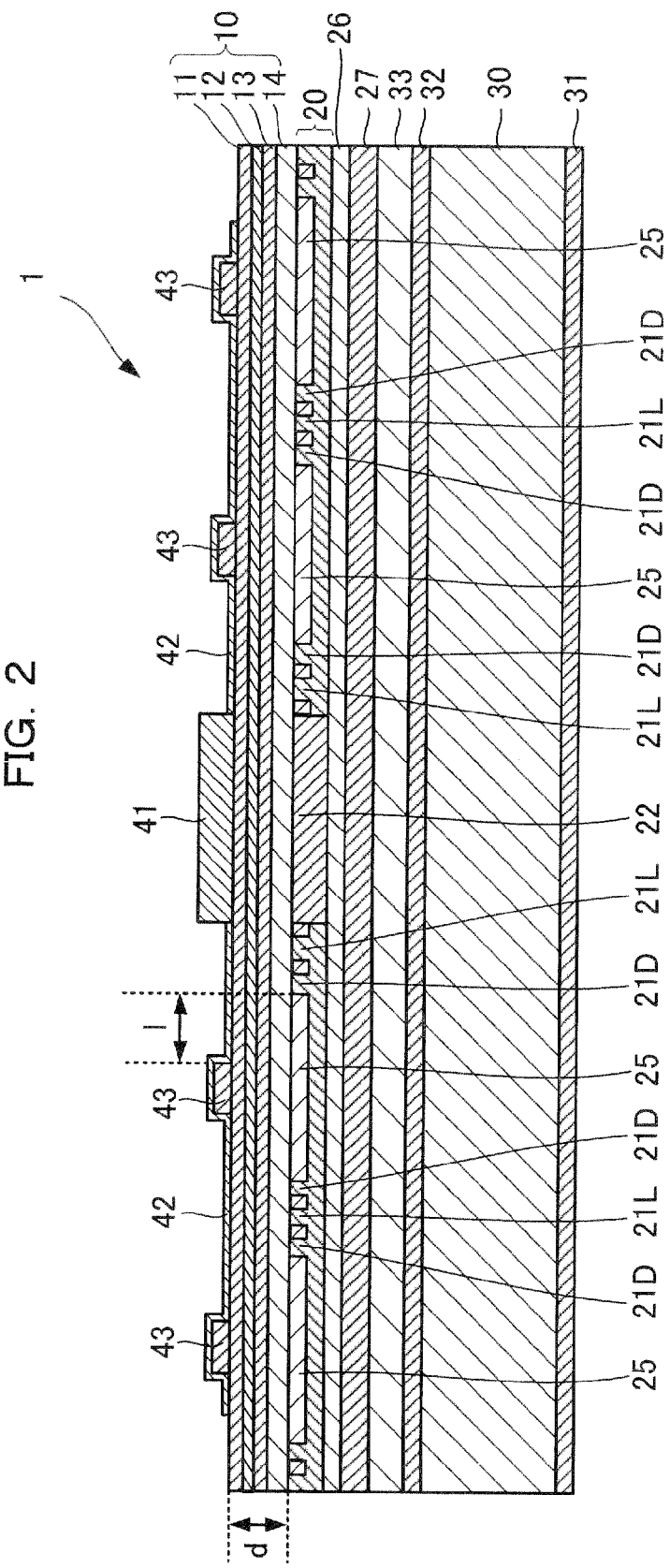
FIG. 2 is a cross-sectional view taken along line 2-2 in FIG. 1.

FIG. 1 is a plan view showing the configuration of a semiconductor light emitting element 1 according to Embodiment 1 of the present invention, and FIG. 2 is a cross-sectional view taken along line 2-2 in FIG. 1. In FIG. 1, a surface electrode provided on the light-extraction-surface side is indicated by solid lines, and a reflecting electrode provided on the light-reflecting-surface side is indicated by broken lines.

The semiconductor light emitting element 1 has a square principal surface of, e.g., 300 μm per side and a so-called stuck-together structure where a semiconductor film 10 and a support substrate 30 are joined via a light reflecting layer 20. The semiconductor film 10 is configured with an n-type clad layer 11, a light emitting layer 12, a p-type clad layer 13, and a p-type contact layer 14 that are laid one over another in that order from the light-extraction-surface side. The n-type clad layer 11 is formed of, e.g., a layer of Si-doped $(Al_{0.6}Ga_{0.4})_{0.5}In_{0.5}P$ of 2.5 μm thickness and a layer of Si-doped $Al_{0.5}In_{0.5}P$ of 0.5 μm thickness, laid one over the other. The light emitting layer 12 has a multi-quantum well structure configured with, e.g., pairs of a well layer made of $(Al_{0.1}Ga_{0.9})_{0.5}In_{0.5}P$ of 20 nm thickness and a barrier layer made of $(Al_{0.5}Ga_{0.5})_{0.5}In_{0.5}P$ of 10 nm thickness that are laid one over another 15 times. The p-type clad layer 13 is made of, e.g., Mg-doped $Al_{0.5}In_{0.5}P$ of 0.5 μm thickness. The p-type contact layer 14 is made of, e.g., Mg-doped GaP of 1.5 μm thickness. Note that the composition ratio of each layer is not limited to the above but can be changed as needed.

On the surface of the n-type clad layer 11 that is the light extraction surface, there is provided a surface electrode formed of an ohmic electrode (first electrode pieces) 43 on the light-extraction-surface side, which forms ohmic contact with the semiconductor film 10; a feed pad (bonding pad; a second electrode piece) 41 to be connected by a bonding wire; and line electrodes 42 for electrically connecting the feed pad 41 and the ohmic electrode 43. The feed pad 41 and the line electrodes 42 are made of material which forms Schottky contact with the n-type clad layer 11. The height of the Schottky barrier is higher than the forward voltage VF until current starts to flow via the ohmic electrode 43, which includes the voltage across the line resistance, and is 0.2 V or higher, preferably 0.5 V or higher. Au, Al, Ag, Cu, Fe, Ni, Pd, Pt, Mo, Ta, Ti, W, or a nitride thereof (e.g., TaN or WN) or a silicide thereof (e.g., WSi or TaSi) can be used as material for the feed pad 41 and the line electrodes 42. The feed pad 41 may be formed by laying Au (about 1 μm thick) on the above-mentioned Schottky electrode material via an adhering layer made of Ti or the like in order to improve the wire bonding strength. The ohmic electrode 43 is made of material which forms ohmic contact with the n-type clad layer 11. The ohmic electrode 43 can be formed by laying a contact layer of AuGeNi (300 nm thick), a barrier layer of Ti/Pt or TaN (200 nm thick), and a current spread layer of Au (200 nm thick) one over another in that order. For example, AuSn, AuGe, AuSnNi, and the like are cited as other materials which can form ohmic contact with the n-type clad layer 11.

Figure 3A:
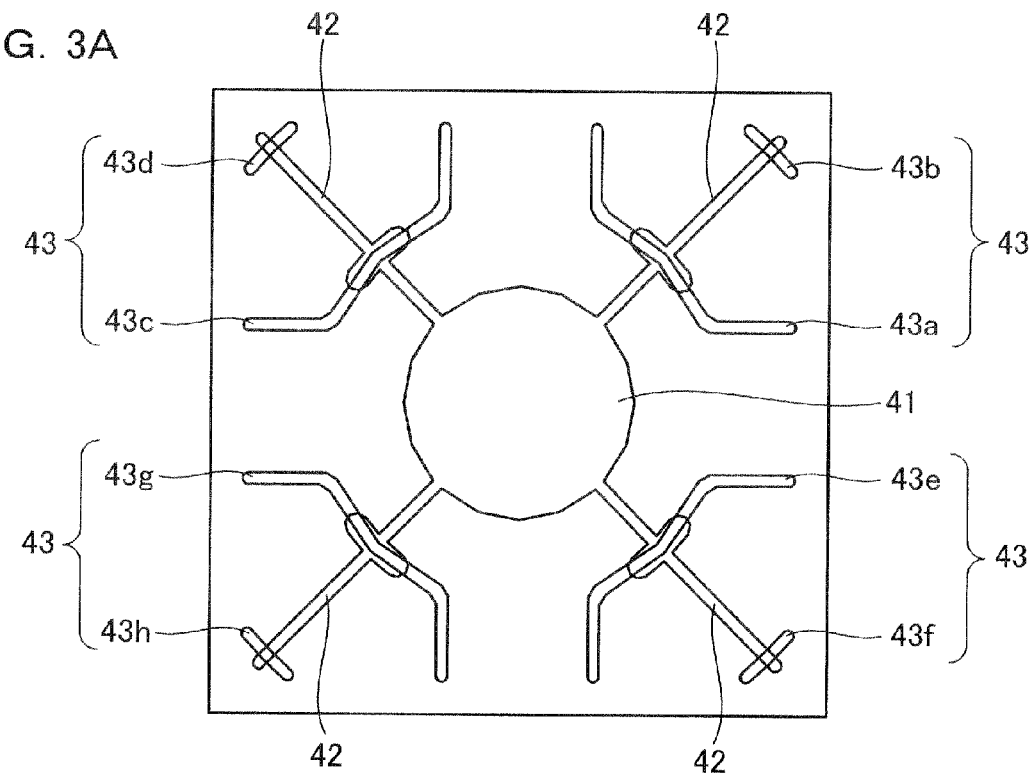
FIG. 3A is a plan view showing the configuration of a surface electrode according to the embodiment of the present invention.

FIG. 3A is a diagram showing only the feed pad 41, the ohmic electrode 43, and the line electrodes 42 that form the surface electrode. The feed pad 41 has a circular shape of, e.g., 100 μm in diameter (7850 μm$^2$) and placed in the center of the light extraction surface. Note that the size of the feed pad 41 is preferably 2500 μm$^2$ or greater and more preferably 5000 μm$^2$ or greater. The linear line electrodes 42 about 5 μm wide extending respectively toward the corners of the semiconductor light emitting element 1 are connected to the feed pad 41. The electrode pieces of the linear ohmic electrode 43 about 5 μm wide are connected respectively to the line electrodes 42. The ohmic electrode 43 is composed of eight electrode pieces 43a to 43h, which are placed in a distributed manner near the corners of the semiconductor light emitting element 1 and somewhat closer to the center, away from the corners. The electrode pieces 43a to 43h of the ohmic electrode 43 placed in a distributed manner are electrically connected to the feed pad 41 via the line electrodes 42. The surface electrode formed of the feed pad 41, the line electrodes 42, and the ohmic electrode 43 has a pattern four-times rotationally symmetric (being the same when rotated 90°) with the center of the semiconductor light emitting element 1 as the rotational center.

The light reflecting layer 20 is provided adjacent to the p-type contact layer 14. The light reflecting layer 20 includes a dielectric layer 25 and a reflecting electrode and forms a light reflecting surface at the surface in contact with the semiconductor film 10. The reflecting electrode is formed of a linear line electrode 21L and island-like dot electrodes 21D that are made of material that forms ohmic contact with the p-type contact layer 14 such as AuZn, and an opposite electrode 22 made of material that forms Schottky contact with the p-type contact layer 14 such as WSi and opposite to the feed pad 41. Note that the linear line electrode 21L and island-like dot electrodes 21D constitute third electrode pieces of the present invention, and the opposite electrode 22 constitutes a fourth electrode piece of the present invention. The dielectric layer 25 is made of, e.g., SiO$_2$ and formed adjacent to the interface with the p-type contact layer 14. The dielectric layer 25 exists between the line electrode 21L, the dot electrodes 21D, and the opposite electrode 22 and separates these electrodes at the surface in contact with the semiconductor film 10. In other words, the dielectric layer 25 defines the pattern of the reflecting electrode. Note that the line electrode 21L, the dot electrodes 21D, and the opposite electrode 22 are connected to each other under the dielectric layer 25. A transparent dielectric material such as Si$_3$N$_4$ or Al$_2$O$_2$ other than SiO$_2$ can also be used as material for the dielectric layer 25.

Figure 3B:
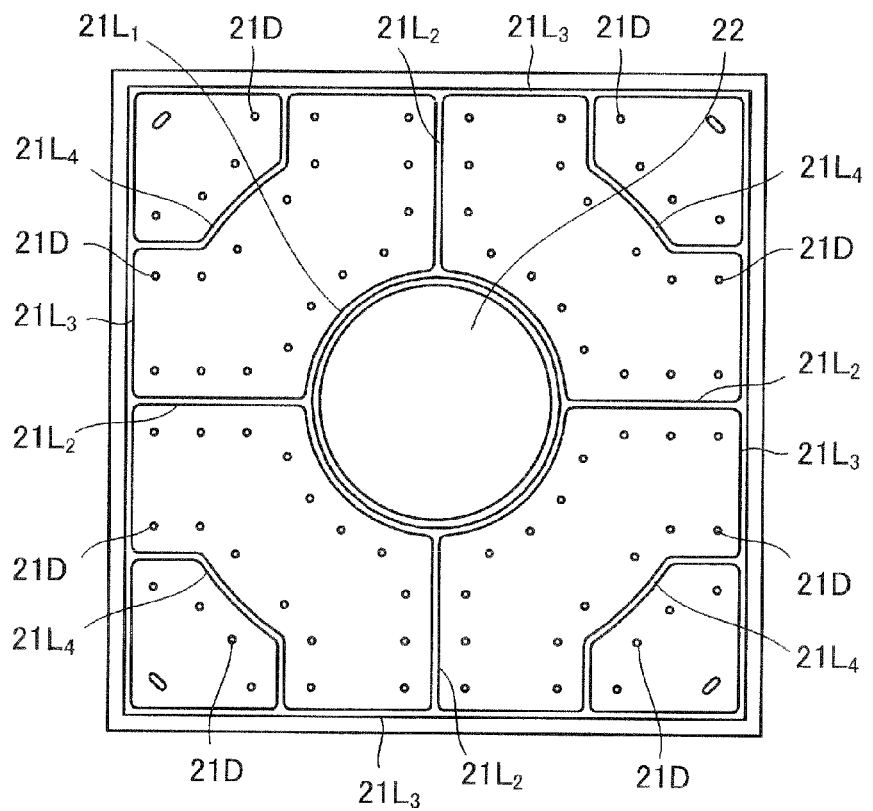
FIG. 3B is a plan view showing the configuration of a reflecting electrode according to the embodiment of the present invention.

FIG. 3B is a diagram showing only the line electrode 21L, the dot electrodes 21D, and the opposite electrode 22 provided on the light-reflecting-surface side. The line electrode 21L is in the shape of a line about 5 μm wide and constituted by an annular first portion 21L$_1$ formed around the outer edge of the opposite electrode 22; second portions 21L$_2$ connected to the first portion 21L$_1$ and extending respectively to the sides of the semiconductor light emitting element 1 to be shaped substantially like a cross; third portions 21L$_3$ connected to the second portions 21L$_2$ and extending along the outer edges of the semiconductor light emitting element 1; and fourth portions 21L$_4$ provided respectively near the corners of the semiconductor light emitting element 1 and connected to the third portions 21L$_3$ so as to join two sides forming a corner as if they straddle the corners. The dot electrodes 21D are in a circular shape of, e.g., about 5 μm in diameter, and the plurality of dot electrodes 21D are placed in a distributed manner along the portions of the line electrode. By placing the dot electrodes 21D in a distributed manner on the light-reflecting-surface side, the current spread inside the semiconductor film 10 is promoted even if the thickness of the semiconductor film 10 is small, and further by providing the line electrode 21L together with them, current constriction to the dot electrodes 21D is prevented.

The opposite electrode 22 is placed directly under the feed pad 41 on the light-extraction-surface side. The opposite electrode 22 is, for example, in a circular shape of the same size as the feed pad 41, but is not limited to this. The size of the opposite electrode 22 may be larger than that of the feed pad 41, and the shape thereof can be changed as needed. The opposite electrode 22 is separated by the dielectric layer 25 provided around its outer edge from the line electrode 21L and the dot electrodes 21D at the surface in contact with the semiconductor film 10. The opposite electrode 22 forms Schottky contact with the semiconductor film 10. Hence, it is the line electrode 21L and the dot electrodes 21D that work as a p-electrode on the light-reflecting-surface side when a forward voltage is applied to the semiconductor film 10.

As shown in FIG. 1, the ohmic electrode 43 (the first electrode pieces) on the light-extraction-surface side and the line electrode 21L and the dot electrodes 21D (the third electrode pieces) on the light-reflecting-surface side are placed so as not to overlap each other when they are projected onto a projection plane parallel to the principal surface of the semiconductor film 10 (the surface perpendicular to the laminating direction of the semiconductor film 10), thus forming so-called counter-electrodes. That is, the line electrode 21L and the dot electrodes 21D are placed on both sides of, and along, the electrode pieces constituting the ohmic electrode 43 on the light-extraction-surface side. The dielectric layer 25 is placed directly under the ohmic electrode 43 on the light-extraction-surface side. With this configuration, current can be diffused widely inside the semiconductor film 10 even if the area of the ohmic electrode 43 on the light-extraction-surface side is made smaller. Further, in the present embodiment, the entire electrode pattern including the surface electrode on the light-extraction-surface side and the reflecting electrode on the light-reflecting-surface side is four-times rotationally symmetric with the center of the semiconductor light emitting element 1 as the rotational center. By this means, when the semiconductor light emitting element 1, a lens, and the like are combined to form an illuminating device, isotropic light distribution can be obtained.

A barrier metal layer 26 is provided on the light reflecting layer 20, and an adhering layer 27 is provided on the barrier metal layer 26. The barrier metal layer 26 may be formed of a single layer or two or more layers including high-melting-point metal such as Ta, Ti, or W or a nitride thereof. The barrier metal layer 26 prevents Zn included in the reflecting electrode from diffusing outside and prevents eutectic binding material (e.g., AuSn) included in a junction layer 33 from diffusing into the reflecting electrode. An adhering layer 27 includes material having high wettability to the eutectic binding material included in the junction layer 33, such as Ni.

The support substrate 30 is a Si substrate imparted with conductivity by doping, e.g., a p-type impurity in a high concentration. On both sides of the support substrate 30 are formed ohmic metal layers 31 and 32 made of, e.g., Pt. The junction layer 33 formed of Ti, Ni, and AuSn laid one over another is provided on the ohmic metal layer 32. The support substrate 30 is joined to the semiconductor film 10 by combining the junction layer 33 and the adhering layer 27. Note that a conductive material such as Ge, Al, or Cu other than Si can also be used as material for the support substrate 30.

Figure 4A:
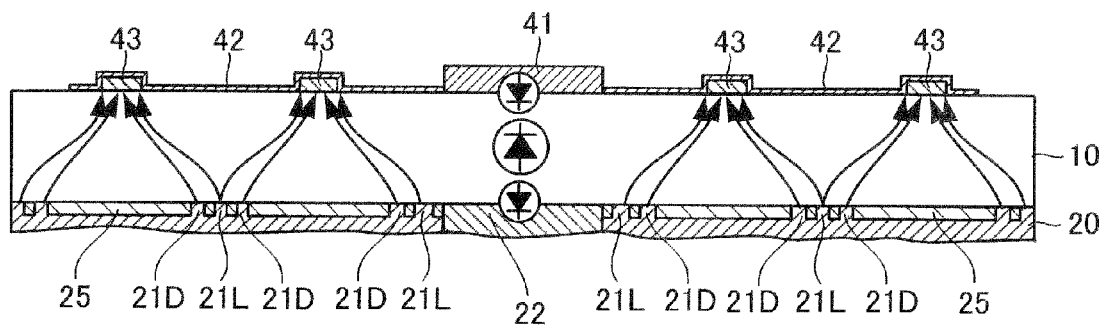
FIG. 4A is a cross-sectional view showing paths of current at the time of light emitting operation of the semiconductor light emitting element according to the embodiment of the present invention.

FIG. 4A is a diagram where arrows indicate paths of current flowing through the semiconductor film 10 at the time of light emitting operation of the semiconductor light emitting element 1 having the above configuration. Currents flow respectively from the line electrode 21L and the dot electrodes 21D on the light-reflecting-surface side, which are in contact with the p-type contact layer 14, to the ohmic electrode 43 at the shortest distance from these on the light-extraction-surface side. Because the ohmic electrode 43, and the line electrode 21L and the dot electrodes 21D are placed so as not to overlap each other when they are projected onto a projection plane parallel to the principal surface of the semiconductor film 10, the directions in which currents flow have a component of a principal surface direction (lateral direction) of the semiconductor film 10, and hence the current spread inside the semiconductor film 10 having a relatively small thickness is promoted, thus making the current density distribution uniform. Meanwhile, since the feed pad 41 forms Schottky contact with the semiconductor film 10, between them is formed a barrier of the opposite direction to that of the diode formed by the pn junction in the semiconductor film 10 (that is, a barrier acting to block the forward current). Hence, current does not flow from any of the line electrode 21L, the dot electrodes 21D, and the opposite electrode 22 on the light-reflecting-surface side to the feed pad 41. Further, since the opposite electrode 22 also forms Schottky contact with the semiconductor film 10, between them is formed a barrier of the opposite direction to that of the diode formed by the pn junction in the semiconductor film 10 (that is, a barrier acting to block the forward current). Hence, almost no current flows out of the opposite electrode 22. That is, at the time of light emitting operation, almost no current flows out of the opposite electrode 22 and flows into the feed pad 41. Current exclusively flows between the ohmic electrode 43 on the light-extraction-surface side and the line electrode 21L and the dot electrodes 21D on the light-reflecting-surface side. By this means, it is possible to almost completely eliminate current flowing into the area immediately under the feed pad 41 at light emitting operation.

If current flows through the area immediately under the feed pad 41, then light is generated in the area not contributing to light extraction because of being blocked by the feed pad 41, resulting in a reduction in the light extraction efficiency. Especially, in the semiconductor light emitting element 1 according to the present embodiment, because the thickness of the semiconductor film 10 is relatively small, a reduction in the light extraction efficiency becomes remarkable if current flows in immediately under the feed pad 41. In the semiconductor light emitting element 1 according to the present embodiment, because the feed pad 41 and the opposite electrode 22 opposite to this are configured to be Schottky electrodes, it is possible to almost completely eliminate current flowing into the area immediately under the feed pad 41 at light emitting operation.

Figure 4B:
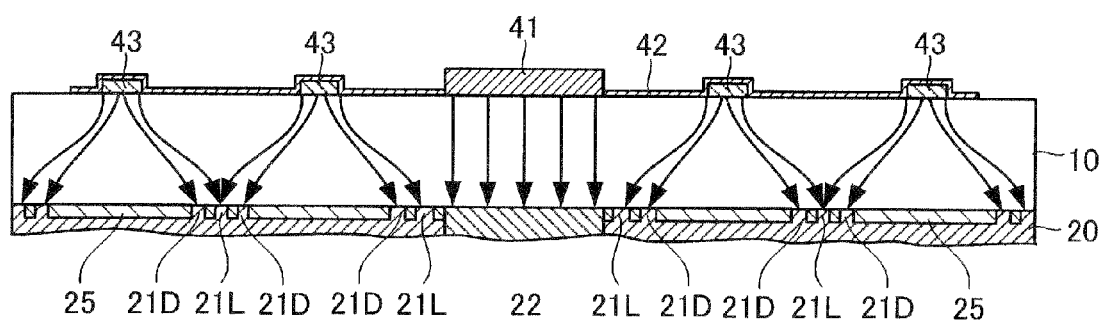
FIG. 4B is a cross-sectional view showing paths of current when a reverse surge voltage is applied.
Figure 4C:
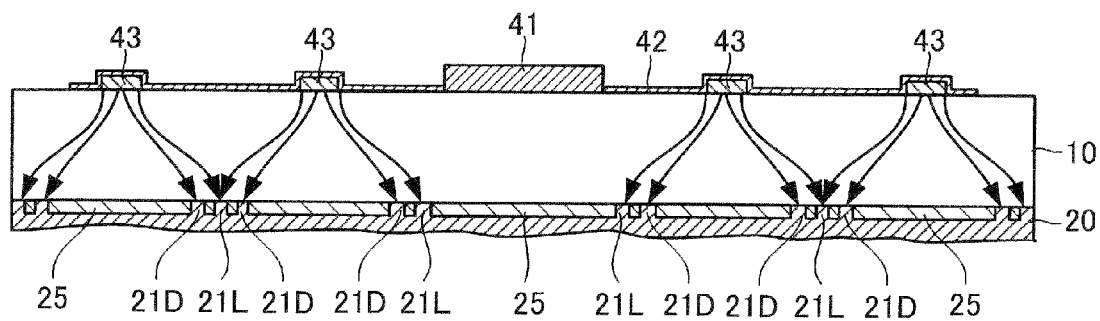
FIG. 4C is a cross-sectional view showing paths of current when a reverse surge voltage is applied of a comparison-example semiconductor light emitting element.

FIG. 4B is a diagram showing paths of current flowing through the semiconductor film 10 of the semiconductor light emitting element 1 when a reverse surge voltage is applied. When a reverse surge voltage is applied to the pn junction in the semiconductor film 10, the Schottky junctions of the feed pad 41 and the opposite electrode 22 with the semiconductor film 10 are biased in a so-called forward direction, and hence current changing exponentially according to voltage flows. Thus, when a reverse surge voltage is applied, a current path of lower resistance is formed between the feed pad 41 and the opposite electrode 22 as compared with the current paths between the ohmic electrode 43 and the line electrode 21L and the dot electrodes 21D. Further, when a reverse surge voltage is applied, current flows from the ohmic electrode 43 on the light-extraction-surface side to the line electrode 21L and the dot electrodes 21D on the light-reflecting-surface side. FIG. 4C is a diagram showing current paths in a comparison-example semiconductor light emitting element not having an opposite electrode opposite to the feed pad 41 when a reverse surge voltage is applied. In the case where no opposite electrode is provided, only paths from the ohmic electrode 43 on the light-extraction-surface side to the line electrode 21L and the dot electrodes 21D on the light-reflecting-surface side are current paths. In this case, if a high voltage is applied, current is constricted to the current path of the smallest resistance (current bunching), resulting in a reduction in the electrostatic-breakdown resistance. The unevenness of resistances occurs due to slight deviations of the electrode placement, and it is difficult to completely eliminate this. Meanwhile, according to the semiconductor light emitting element 1 of the present embodiment, when a reverse surge voltage is applied, a current path of remarkably lower resistance is formed between the feed pad 41 and the opposite electrode 22 as compared with the current paths between the ohmic electrode 43 and the line electrode 21L and the dot electrodes 21D, and hence current constriction between the ohmic electrodes is alleviated, thus greatly improving the electrostatic-breakdown resistance. When a reverse surge voltage is applied, current flows preferentially through the current path between the feed pad 41 and the opposite electrode 22. Further, the distance between the feed pad 41 and the opposite electrode 22 is shorter than the distance between the ohmic electrode 43 and the line electrode 21L and the dot electrodes 21D. Hence, current constriction is efficiently alleviated, thus improving the electrostatic-breakdown resistance. And as shown in FIG. 2, by making the distance d between the feed pad 41 and the opposite electrode 22 (i.e., the thickness of the semiconductor film 10) be smaller than the smallest distance l in a principal surface direction of the semiconductor film 10 between the ohmic electrode 43 on the light-extraction-surface side and the line electrode 21L and the dot electrodes 21D on the light-reflecting-surface side (l>d), the resistance of the surge current path formed between the feed pad 41 and the opposite electrode 22 can be made smaller, thus further increasing the effect of improving the electrostatic-breakdown resistance.

Next, a manufacturing method of the semiconductor light emitting element 1 having the above configuration will be described with reference to FIGS. 5A to 5D and FIGS. 6A to 6C.

(Semiconductor Film Formation)

Figure 5A:
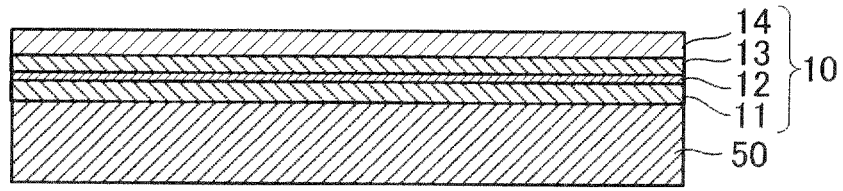
FIGS. 5A to 5D are cross-sectional views showing a manufacturing method of the semiconductor light emitting element according to the embodiment of the present invention.

The semiconductor film 10 was formed by a metal organic chemical vapor deposition method (MOCVD method). An n-type GaAs substrate of 300 μm thickness which slopes at an angle of 15° in the [011] direction relative to the (100) plane was used as a growth substrate 50 for use in the crystal growth of the semiconductor film 10. The n-type clad layer 11 formed of a layer of Si-doped $(Al_{0.6}Ga_{0.4})_{0.5}In_{0.5}P$ of 2.5 μm thickness and a layer of Si-doped $Al_{0.5}In_{0.5}P$ of 0.5 μm thickness, laid one over the other, was formed on the growth substrate 50. The light emitting layer 12 was formed on the n-type clad layer 11. The light emitting layer 12 was made to have a multi-quantum well structure where pairs of a well layer made of $(Al_{0.1}Ga_{0.9})_{0.5}In_{0.5}P$ of 20 nm thickness and a barrier layer made of $(Al_{0.5}Ga_{0.5})_{0.5}In_{0.5}P$ of 10 nm thickness are laid one over another 15 times. Note that the proportion z of Al of the well layers can be changed in the range of $0 \leq z \leq 0.4$, corresponding to the light emission wavelength. The p-type clad layer 13 made of Mg-doped $Al_{0.5}In_{0.5}P$ of 0.5 μm thickness was formed on the light emitting layer 12. Note that the proportion z of Al of the n-type clad layer 11 and the p-type clad layer 13 can be changed in the range of $0.4 \leq z \leq 1.0$. The p-type contact layer 14 made of Mg-doped GaP of 1.5 μm thickness was formed on the p-type clad layer 13. The p-type contact layer 14 can contain In at a proportion in such a range that the layer does not absorb light from the light emitting layer 12. The semiconductor film 10 is composed of these layers (FIG. 5A). Note that phosphine ($PH_3$) was used as a Group V material and that organic metals which are trimethylgallium (TMGa), trimethylaluminum (TMAl), and trimethylindium (TMI) were used as Group III materials. Silane ($SiH_4$) was used as material for Si that is an n-type impurity, and biscyclopentadienyl magnesium ($Cp_2Mg$) was used as material for Mg that is a p-type impurity. Growth temperature was 750 to 850° C.; hydrogen was used as a carrier gas; and growth pressure was 10 kPa.

(Light Reflecting Film and Metal Layer Formation)

Figure 5B:
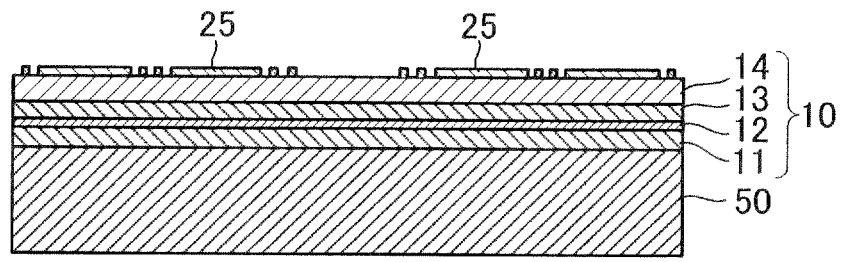

An $SiO_2$ film constituting the dielectric layer 25 was formed by a plasma CVD method on the p-type contact layer 14. The thickness d of the $SiO_2$ film is set to satisfy $d=m \cdot \lambda_0/4n$, where $\lambda_0$ is the light emission wavelength in a vacuum, n is the refractive index of the $SiO_2$ film, and m is an arbitrary integer. Here, letting $\lambda_0=625$ nm, n=1.45, and m=1, then the thickness d of the dielectric layer 25 was 107 nm. Subsequently, a resist mask was formed on the $SiO_2$ film, and then etching was perform using buffered hydrofluoric acid (BHF) to perform patterning corresponding to the pattern of the line electrode 21L, the dot electrodes 21D, and the opposite electrode 22 on the $SiO_2$ film. That is, the $SiO_2$ film has made therein openings corresponding to the regions where to form the line electrode 21L, the dot electrodes 21D, and the opposite electrode 22, and through the openings, the p-type contact layer 14 is partially exposed (FIG. 5B). Note that a thermal CVD method or a sputtering method can also be used as the film forming method of the $SiO_2$ film. Further, a dry etching method can be used as the etching method of the $SiO_2$ film. Another transparent dielectric material such as $Si_3N_4$ or $Al_2O_2$ than $SiO_2$ can be used as material for the dielectric layer 25.

Figure 5C:
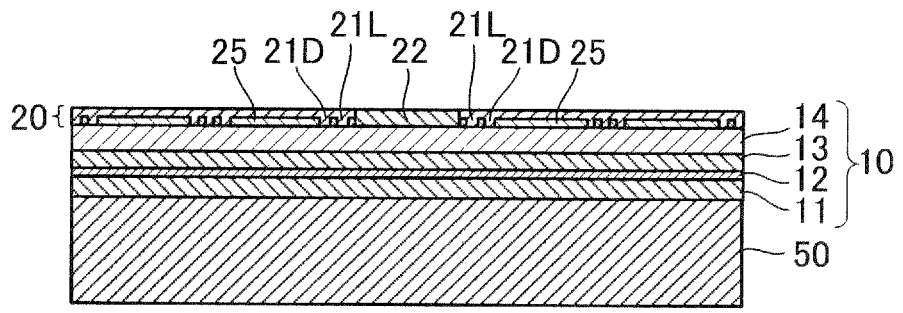

Then, a resist mask (not shown) having an opening only at the region where to form the opposite electrode 22, was formed over the dielectric layer 25. Then, after WSi that is a material to form Schottky contact with the semiconductor film 10 was deposited by an EB evaporation method via the resist mask and the dielectric layer 25 over the semiconductor film 10, the resist mask was removed, thereby forming the opposite electrode 22. Subsequently, AuZn that is a material to form ohmic contact with the semiconductor film 10 was deposited by an EB evaporation method via the dielectric layer 25 over the semiconductor film 10 to form the line electrode 21L and the dot electrodes 21D. The dielectric layer 25 and the reflecting electrode constitute the light reflecting layer 20 (FIG. 5C).

Next, TaN (100 nm thickness), TiW (100 nm thickness), and TaN (100 nm thickness) were sequentially deposited over the light reflecting film 20 by a sputtering method to form the barrier metal layer 26. Note that the barrier metal layer 26 may be constituted by a single layer or two or more layers including high-melting-point metal such as Ta, Ti, or W, or a nitride thereof. The barrier metal layer 26 may be formed using an EB evaporation method instead of the sputtering method. Then, heat treatment was performed in a nitrogen atmosphere at about 500° C. Thereby, good ohmic contact was formed between the p-type contact layer 14 and the line electrode 21L, the dot electrodes 21D, and the opposite electrode 22.

Figure 5D:
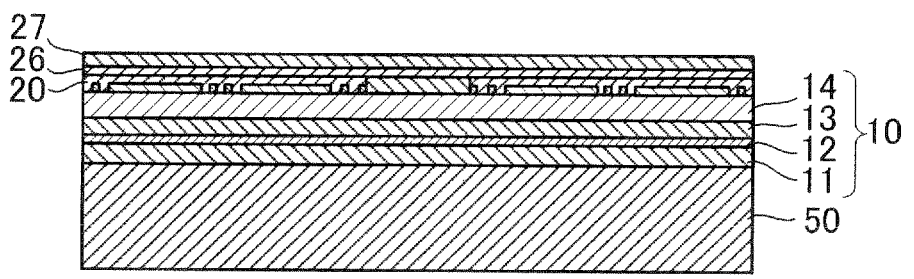

Then, Ni (300 nm thickness) and Au (30 nm thickness) were sequentially formed over the barrier metal layer 26 by an EB evaporation method to form the adhering layer 27. Note that a resistance heating evaporation method or a sputtering method can be used to form the adhering layer 27 (FIG. 5D).

(Bonding of the Support Substrate)

A Si substrate imparted with conductivity by doping with a p-type impurity was used as the support substrate 30 for supporting the semiconductor film 10. The ohmic metal layers 31 and 32 made of Pt and 200 nm thick were formed on opposite surfaces of the support substrate 30. Subsequently, Ti (150 nm thickness), Ni (100 nm thickness), and AuSn (600 nm thickness) were sequentially deposited over the ohmic metal layer 32 by a sputtering method to form the junction layer 33. The AuSn layer functions as the eutectic binding material. The Ni layer has a function to improve wettability to the eutectic binding material. The Ti layer has a function to improve adhesion between the Ni and the ohmic metal layer 32. For the ohmic metal layers 31, 32, another material which can form ohmic contact with the Si substrate such as Au, Ni, or Ti can be used, not being limited to Pt. The support substrate 30 may be made of another material which has conductivity and high thermal conductivity such as Ge, Al, or Cu.

Figure 6A:
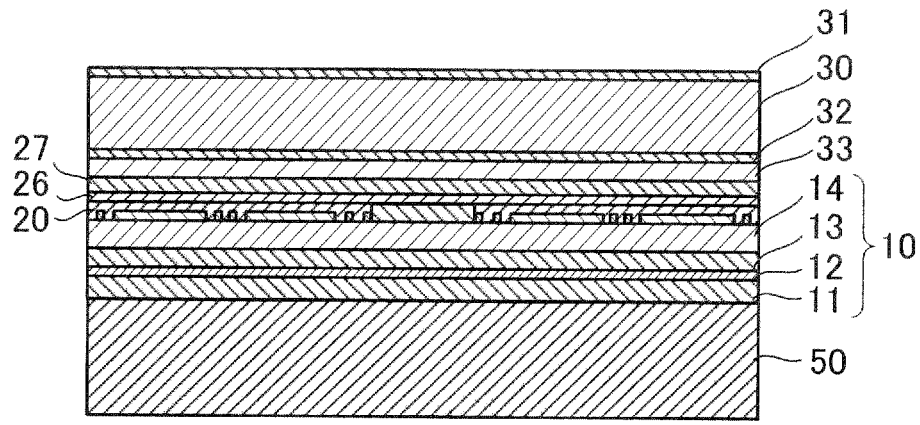
FIGS. 6A to 6C are cross-sectional views showing the manufacturing method of the semiconductor light emitting element according to the embodiment of the present invention.

The semiconductor film 10 and the support substrate 30 were bonded by thermal compression. The adhering layer 27 on the semiconductor film 10 side and the junction layer 33 on the support substrate 30 side were put in close contact and kept in a nitrogen atmosphere at 1 MPa and 330° C. for 10 minutes. The eutectic binding material (AuSn) included in the junction layer 33 on the support substrate 30 side melts and, together with the adhering layer 27 (Ni/Au) on the semiconductor film 10 side, forms AuSnNi, and thereby the support substrate 30 and the semiconductor film 10 are bonded together (FIG. 6A).

(Removal of the Growth Substrate)

Figure 6B:
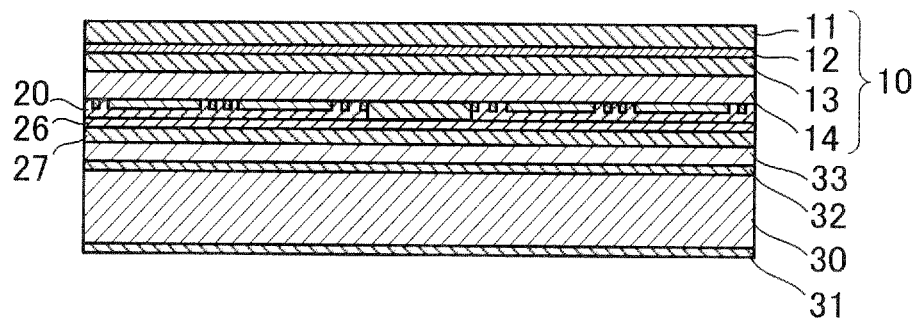

The growth substrate 50 used in the crystal growth of the semiconductor film 10 was removed by wet etching using a mixture of ammonia water and hydrogen peroxide water. Note that a dry etching method, a mechanical polishing method, a chemical mechanical polishing method (CMP), or a combination thereof may be used for removing the growth substrate 50 (FIG. 6B).

(Forming of the Light Extracting Structure)

On the surface of the n-type clad layer 11 exposed by removing the growth substrate, a photonic crystal was formed as a light extracting structure to improve the light extraction efficiency. A resist mask for an artificial periodic structure (not shown) was formed on the n-type clad layer 11 by photolithography, and then a photonic crystal comprising multiple conic projections was formed in the surface of the n-type clad layer 11 by dry etching the surface of the n-type clad layer via the resist mask. The conic projections were formed in a triangle lattice array to be of a pitch of 500 nm, a height of 600 nm, and an aspect ratio of 1.2. Instead, a method such as EB lithography, EB drawing, nano-imprint, or laser exposure can be used in patterning the resist mask. The multiple projections forming the photonic crystal may be in a cylindrical shape, a pyramid shape, a prism shape, or the like and should be of a pitch of 300 nm to 1000 nm and an aspect ratio of 0.7 to 1.5. Further, instead of a photonic crystal, by roughening the surface of the n-type clad layer 11 by wet etching, the light extracting structure may be formed.

(Forming of the Surface Electrode)

Figure 6C:
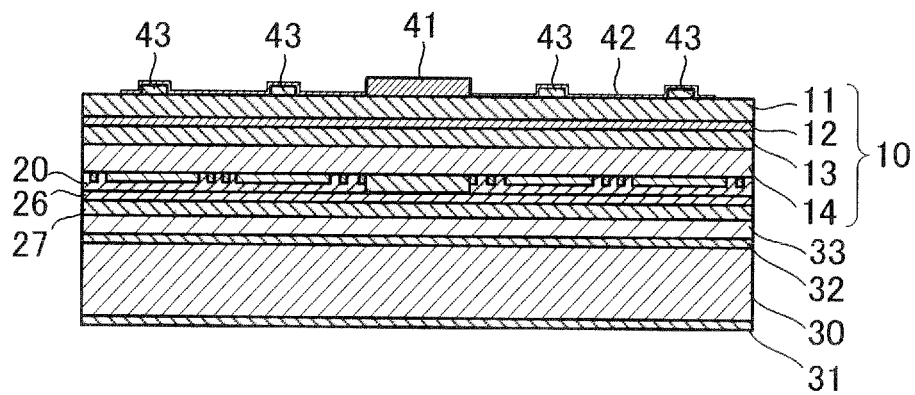

The ohmic electrode 43, the feed pad 41, and the line electrodes 42 were formed on the surface of the n-type clad layer 11. After AuGeNi was deposited by an EB evaporation method over the n-type clad layer 11 to form ohmic contact with the n-type clad layer 11, patterning was performed by a lift-off method to form the ohmic electrode 43. Subsequently, Ti (100 nm thickness) was deposited by an EB evaporation method over the n-type clad layer 11 to form Schottky contact with the n-type clad layer 11, and further Au (1.5 µm thickness) was deposited over the Ti. Then, patterning was performed by a lift-off method to form the feed pad 41 and the line electrodes 42. Note that AuGe, AuSn, AuSnNi, or the like can also be used as material for the ohmic electrode 43. Further, Ta, W, WSi, Pt, Cu or an alloy thereof, or a nitride thereof can also be used as material for the feed pad 41 and the line electrodes 42. Then, heat treatment was performed in a nitrogen atmosphere at 400° C. to promote the formation of ohmic contact between the n-type clad layer 11 and the ohmic electrode 43 (FIG. 6C). By undergoing the above processes, the semiconductor light emitting element 1 is finished.

As obvious from the above description, according to the semiconductor light emitting element 1 of the present embodiment, in a light emitting element having the so-called stuck-together structure where the thickness of the semiconductor film is relatively small, uniform current spread inside the semiconductor film can be achieved with suppressing the covering rate of the surface electrode. Thus, a light emitting element of high light extraction efficiency without brightness unevenness can be provided.

Further, the feed pad 41 and the opposite electrode 22 form Schottky electrodes, so that barriers to act to block the forward current flowing through the semiconductor film 10 are formed in opposite positions on the light-extraction-surface side and on the light-reflecting-surface side of the semiconductor film 10. By this means, at the time of light emitting operation, almost no current flows into the area immediately under the feed pad 41, so that no light is generated in this area. In contrast, when a reverse surge voltage is applied, a current path of lower resistance is formed between the feed pad 41 and the opposite electrode 22 as compared with the current paths between the ohmic electrode 43 and the line electrode 21L and the dot electrodes 21D, and hence current constriction between the ohmic electrodes is alleviated, thus improving the electrostatic-breakdown resistance. As such, according to the semiconductor light emitting element 1 of the present embodiment, at light emitting operation, current is prevented from flowing into the area immediately under the feed pad 41, whereas, when a reverse voltage is applied, a current path of lower resistance is formed between the feed pad 41 and the opposite electrode 22 than the current paths between the ohmic electrode 43 and the line electrode 21L and the dot electrodes 21D. Hence, with avoiding a reduction in the light extraction efficiency and a reduction in the light output at light emitting operation, it is possible to improve the breakdown resistance to reverse electrostatic surges. Especially, as to a semiconductor light emitting element having a light reflecting layer between the semiconductor film and the support substrate, with the thickness of the semiconductor film being relatively small, the electrostatic-breakdown resistance is likely to be insufficient, but with the configuration of the present embodiment, the electrostatic-breakdown resistance can be greatly improved. Also in the case where a light extracting structure such as a photonic crystal is used, sufficient electrostatic-breakdown resistance can be secured.

Embodiment 2

Figure 7:
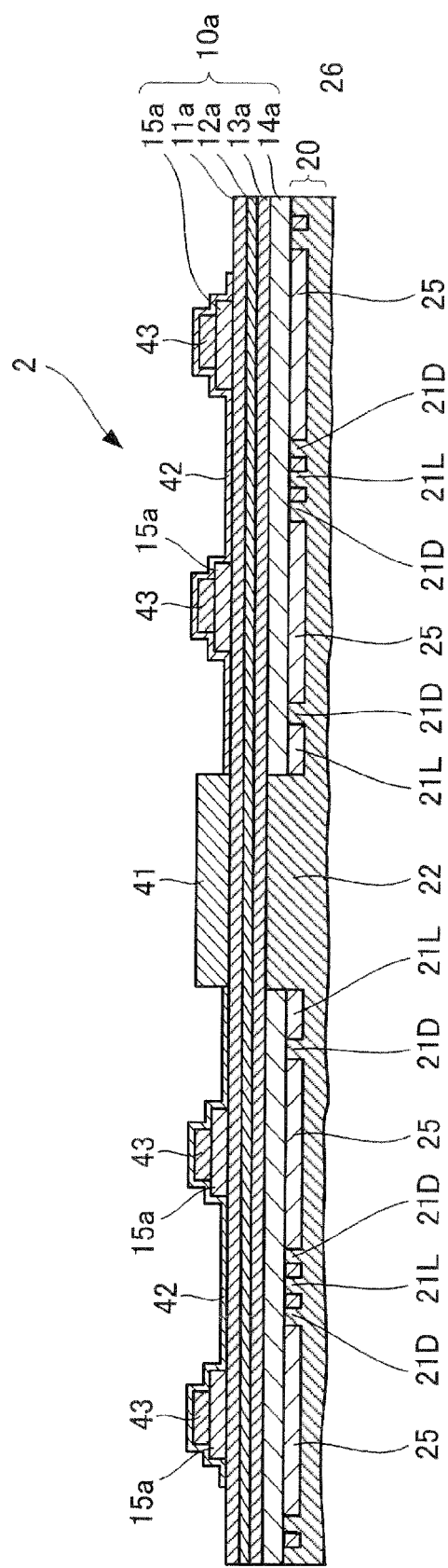
FIG. 7 is a cross-sectional view showing the configuration of a semiconductor light emitting element according to Embodiment 2 of the present invention.

FIG. 7 is a cross-sectional view showing the configuration of a semiconductor light emitting element 2 according to Embodiment 2 of the present invention. In FIG. 7, the part below the light reflecting layer 20 is the same as in the semiconductor light emitting element 1 according to the above embodiment 1 and hence is omitted.

In the semiconductor light emitting element 2, a semiconductor film 10a is provided with an n-type contact layer 15a of a relatively high carrier concentration and an n-type clad layer 11a of a relatively low carrier concentration on the light-extraction-surface side of a light emitting layer 12a, and a p-type contact layer 14a of a relatively high carrier concentration and a p-type clad layer 13a of a relatively low carrier concentration on the light-reflecting-surface side thereof.

The n-type contact layer 15a is made of, e.g., GaAs of 10 nm thickness having a carrier concentration of $1\times10^{19}$ cm$^{-3}$. The n-type clad layer 11a is formed of, e.g., a layer of $(Al_{0.6}Ga_{0.4})_{0.5}In_{0.5}P$ of 2.5 µm thickness having a carrier concentration of $1\times10^{17}$ cm$^{-3}$ and a layer of $Al_{0.5}In_{0.5}P$ of 0.5 lam thickness having a carrier concentration of $1\times10^{17}$ cm$^{-3}$ that are laid one over the other. The light emitting layer 12a has a multi-quantum well structure configured with, e.g., pairs of a well layer of $(Al_{0.1}Ga_{0.9})_{0.5}In_{0.5}P$ of 20 nm thickness and a barrier layer of $(Al_{0.5}Ga_{0.5})_{0.5}In_{0.5}P$ of 10 nm thickness that are laid one over another 15 times. The p-type clad layer 13a is made of, e.g., $Al_{0.5}In_{0.5}P$ of 0.5 µm thickness having a carrier concentration of $5\times10^{17}$ cm$^{-3}$. The p-type contact layer 14a is made of, e.g., GaP of 10 nm thickness having a carrier concentration of $1\times10^{19}$ cm$^{-3}$. The n-type contact layer 15a is formed to partially cover the n-type clad layer 11a, and the p-type contact layer 14a is formed to partially cover the p-type clad layer 13a. That is, as to the semiconductor film 10a, the n-type contact layer 15a and the n-type clad layer 11a of different carrier concentrations are exposed on the light-extraction-surface side thereof, and the p-type contact layer 14a and the p-type clad layer 13a of different carrier concentrations are exposed on the light-reflecting-surface side thereof. Note that the composition ratio and thickness of each layer is not limited to the above but can be changed as needed.

An ohmic electrode 43 and a feed pad 41 on the light-extraction-surface side can be made of the same material. These electrodes can be made of, e.g., AuGeNi, AuSn, AuGe, AuSnNi, or the like, which are candidate materials for ohmic electrodes. The ohmic electrode 43 is formed on the n-type contact layer 15a of a relatively high carrier concentration and forms ohmic contact with the n-type contact layer 15a. The feed pad 41 is formed on part of the n-type clad layer 11a of a relatively low carrier concentration exposed by partially removing the n-type contact layer 15a and forms Schottky contact with the n-type clad layer 11a.

Meanwhile, a line electrode 21L, dot electrodes 21D, and an opposite electrode 22 on the light-reflecting-surface side can be made of the same material. These electrodes can be made of, e.g., AuZn or the like, which is a candidate material for ohmic electrodes. The line electrode 21L and the dot electrodes 21D are formed on the p-type contact layer 14a of a relatively high carrier concentration and forms ohmic contact with the p-type contact layer 14a. The opposite electrode 22 is formed on part of the p-type clad layer 13a of a relatively low carrier concentration exposed by partially removing the p-type contact layer 14a and forms Schottky contact with the p-type clad layer 13a.

In the semiconductor light emitting element 1 according to the above embodiment 1, ohmic contact and Schottky contact are formed using different electrode materials on each of the light-extraction-surface side and the light-reflecting-surface side. In contrast, in the semiconductor light emitting element 2 according to the present embodiment, the ohmic electrode 43 and the feed pad 41 constituting the surface electrode are the same in material, and the line electrode 21L, the dot electrodes 21D, and the opposite electrode 22 constituting the reflecting electrode are the same in material. And ohmic contact or Schottky contact is formed depending on the carrier concentration of the semiconductor film with which each electrode is in contact as described above. The respective carrier concentrations of the semiconductor film for ohmic contact and Schottky contact are set as needed according to the material of the semiconductor film and the electrode material. The above embodiment illustrates the case where Schottky contact is formed with the p-type clad layer 13a of AlInP and where ohmic contact is formed with the p-type contact layer 14a of GaP, but is not limited to this. For example, Schottky contact may be formed with a first GaP layer of a relatively low carrier concentration (e.g., $5\times10^{17}$ $cm^{-3}$), and ohmic contact may be formed with a second GaP layer of a relatively high carrier concentration (e.g., $1\times10^{19}$ $cm^{-3}$).

FIG. 8A is a diagram showing paths of current flowing through the semiconductor film 10a at the time of light emitting operation of the semiconductor light emitting element 2 having the above configuration. Currents flow respectively from the line electrode 21L and the dot electrodes 21D, which are in contact with the p-type contact layer 14a, to the ohmic electrode 43 at the shortest distance from these on the light-extraction-surface side. Because the ohmic electrode 43, and the line electrode 21L and the dot electrodes 21D are placed so as not to overlap each other when they are projected onto a projection plane parallel to the principal surface of the semiconductor film 10, the directions in which currents flow have a component of a principal surface direction (lateral direction) of the semiconductor film 10a, and hence the current spread inside the semiconductor film 10a having a relatively small thickness is promoted, thus making the current density distribution uniform. Meanwhile, since the feed pad 41 forms Schottky contact with the semiconductor film 10a, between them is formed a barrier of the opposite direction to that of the diode formed by the pn junction in the semiconductor film 10a (that is, a barrier acting to block the forward current). Hence, current does not flow from any of the line electrode 21L, the dot electrodes 21D, and the opposite electrode 22 on the light-reflecting-surface side to the feed pad 41. Further, since the opposite electrode 22 also forms Schottky contact with the semiconductor film 10a, between them is formed a barrier of the opposite direction to that of the diode formed by the pn junction in the semiconductor film 10a (that is, a barrier acting to block the forward current). Hence, almost no current flows out of the opposite electrode 22. That is, at the time of light emitting operation, almost no current flows out of the opposite electrode 22 and flows into the feed pad 41. Current exclusively flows between the ohmic electrode 43 on the light-extraction-surface side and the line electrode 21L and the dot electrodes 21D on the light-reflecting-surface side. By this means, it is possible to almost completely eliminate current flowing into the area immediately under the feed pad 41 at light emitting operation.

FIG. 8B is a diagram showing paths of current flowing through the semiconductor film 10a of the semiconductor light emitting element 2 when a reverse surge voltage is applied. When a reverse voltage is applied to the pn junction in the semiconductor film 10a, the Schottky junctions of the feed pad 41 and the opposite electrode 22 with the semiconductor film 10a are biased in a so-called forward direction, and hence current changing exponentially according to voltage flows. Thus, when a reverse surge voltage is applied, a current path of lower resistance is formed between the feed pad 41 and the opposite electrode 22 as compared with the current paths between the ohmic electrode 43 and the line electrode 21L and the dot electrodes 21D. Further, when a reverse surge voltage is applied, current flows from the ohmic electrode 43 on the light-extraction-surface side to the line electrode 21L and the dot electrodes 21D on the light-reflecting-surface side.

As such, also in the semiconductor light emitting element 2 according to the present embodiment, as in Embodiment 1, at the time of light emitting operation, current is prevented from flowing into the area immediately under the feed pad 41, whereas, when a reverse surge voltage is applied, a current path of lower resistance is formed between the feed pad 41 and the opposite electrode 22 than the current paths between the ohmic electrode 43 and the line electrode 21L and the dot electrodes 21D. Hence, with avoiding a reduction in the light extraction efficiency and a reduction in the light output at light emitting operation, it is possible to improve the breakdown resistance to reverse electrostatic surges.

The semiconductor light emitting element 2 can be manufactured by, e.g., the process as follows. The n-type contact layer 15a, the n-type clad layer 11a, the light emitting layer 12a, the p-type clad layer 13a, and the p-type contact layer 14a are formed over a GaAs substrate that is a growth substrate by the MOCVD method or the like. The composition and carrier concentration of each layer are as mentioned above. The dopant of the n-type clad layer 11a and the n-type contact layer 15a is, for example, Si, and the dopant of the p-type clad layer 13a and the p-type contact layer 14a is, for example, Mg. Then, the p-type contact layer 14a is partially removed by photolithography and etching to make the p-type clad layer 13a exposed at the region where to form the opposite electrode 22. Then, after $SiO_2$ constituting the dielectric layer 25 is formed and patterned, AuZn is deposited over the dielectric layer 25 by an EB evaporation method or the like to form the reflecting electrode. The reflecting electrode is divided into the line electrode 21L, the dot electrodes 21D, and the opposite electrode 22 according to the pattern of the dielectric layer 25. The line electrode 21L and the dot electrodes 21D are formed on the p-type contact layer 14a of a relatively high carrier concentration. The opposite electrode 22 is formed on the p-type clad layer 13a of a relatively low carrier concentration. Then, a support substrate is bonded via a plurality of metal layers onto the light reflecting layer 20 by the same process as in the above embodiment 1. Next, the GaAs substrate that is the growth substrate is removed to make the n-type contact layer 15a exposed. Then, the n-type contact layer 15a is partially removed by photolithography and etching to make the n-type clad layer 11a exposed at the region where to form the feed pad 41. Then, after AuGeNi or the like is deposited over the surfaces of the n-type clad layer 11a and the n-type contact layer 15a by an EB evaporation method or the like, this layer is patterned to form the reflecting electrode. The ohmic electrode 43 is formed on the n-type contact layer 15a of a relatively high carrier concentration. The feed pad 41 is formed on the n-type clad layer 11a of a relatively low carrier concentration. By undergoing the above processes, the semiconductor light emitting element 2 is finished.

Embodiment 3

Figure 9A:
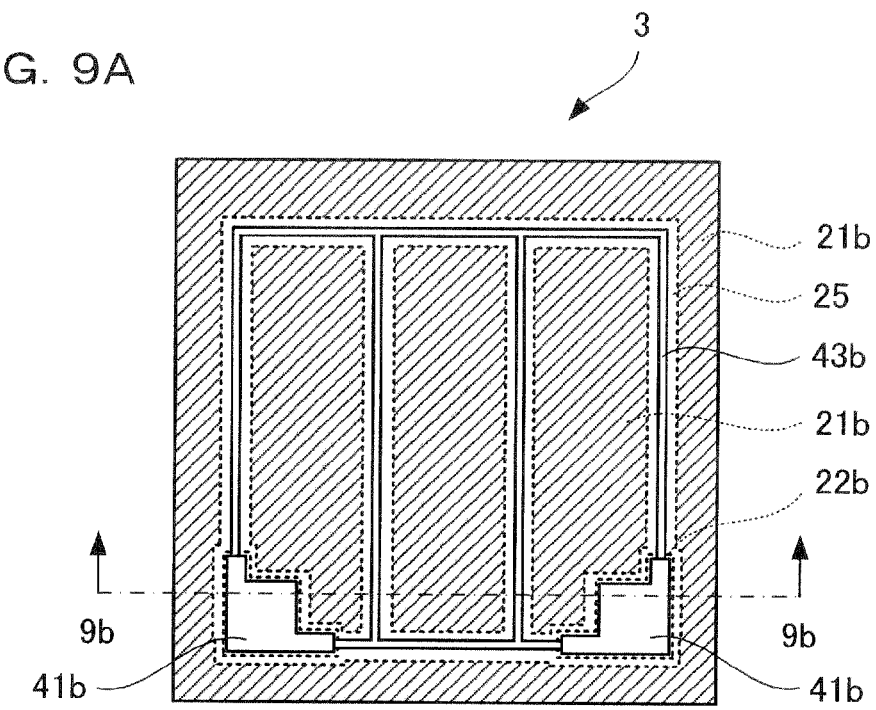
FIG. 9A is a plan view showing the configuration of a semiconductor light emitting element according to Embodiment 3 of the present invention.
Figure 9B:
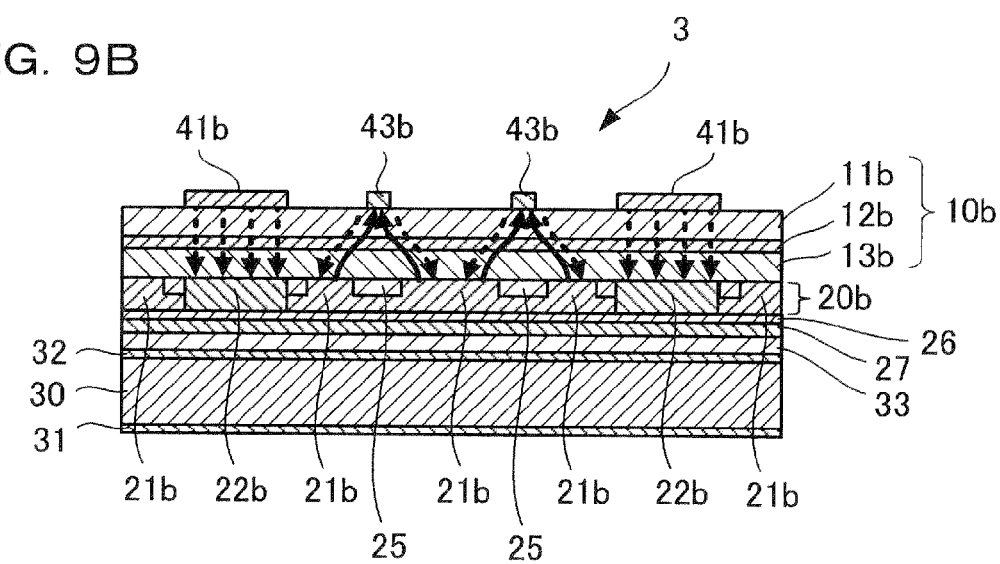
FIG. 9B is a cross-sectional view taken along line 9b-9b in FIG. 9A.

FIG. 9A is a plan view showing the configuration of a semiconductor light emitting element 3 according to Embodiment 3 of the present invention, and FIG. 9B is a cross-sectional view taken along line 9b-9b in FIG. 9A. In FIG. 9A, a surface electrode provided on the light-extraction-surface side is indicated by solid lines, and a reflecting electrode provided on the light-reflecting-surface side is indicated by broken lines and hatching. The semiconductor light emitting element 3 differs mainly in the material of the semiconductor film and the electrode configuration from the semiconductor light emitting element 1 according to the previously-described embodiment 1. The other configuration is the same as in the semiconductor light emitting element 1 according to the embodiment 1.

The semiconductor film 10b is constituted by a GaN-based semiconductor and configured with an n-type clad layer 11b, a light emitting layer 12b, and a p-type clad layer 13b that are laid one over another in that order from the light-extraction-surface side. The n-type clad layer 11b is formed of, e.g., Si-doped GaN of 5 μm thickness. The light emitting layer 12b has a multi-quantum well structure configured with, e.g., pairs of a well layer of $In_{0.35}Ga_{0.65}N$ of 2 nm thickness and a barrier layer of GaN of 14 nm thickness that are laid one over another 5 times. The p-type clad layer 13b is formed of, e.g., a layer of Mg-doped $Al_{0.2}Ga_{0.8}N$ of 40 nm thickness and a layer of Mg-doped GaN of 100 nm thickness that are laid one over the other.

On the surface of the n-type clad layer 11b that is the light extraction surface, there is provided a surface electrode formed of an ohmic electrode (first electrode pieces) 43b, which forms ohmic contact with the n-type clad layer 11b, and feed pads (bonding pads; second electrode pieces) 41b to be connected by a bonding wire. The feed pads 41b can be made of material which forms Schottky contact with the n-type clad layer 11b, such as Au, Al, Ag, Cu, Fe, Ni, Pd, Pt, Mo, Ta, Ti, W, or a nitride thereof (e.g., TaN or WN) or a silicide thereof (e.g., WSi or TaSi). The ohmic electrode 43b is made of material which forms ohmic contact with the n-type clad layer 11b and configured with, e.g., Ti (1 nm thickness) and Al (200 nm thickness)/Au (1000 nm thickness) on the Ti that are laid one over another in that order. The feed pads 41b are respectively placed near two corners at opposite ends of one side of the semiconductor light emitting element 3. The ohmic electrode 43b is connected to the feed pads 41b and in the shape of a line extending over the surface of the n-type clad layer 11b to supply current throughout the semiconductor film 10b.

The light reflecting layer 20b provided adjacent to the p-type clad layer 13b comprises a dielectric layer 25 and a reflecting electrode and forms a light reflecting surface at the surface in contact with the semiconductor film 10b. The reflecting electrode is formed of an ohmic electrode (third electrode pieces) 21b on the light-reflecting-surface side, which, together with the ohmic electrode 43b on the light-extraction-surface side, forms counter-electrodes, and opposite electrodes (fourth electrode pieces) 22b respectively opposite to the two feed pads 41b. The ohmic electrode 21b is made of material which forms ohmic contact with the p-type clad layer 13b, such as Pt. The opposite electrodes 22b is made of material which forms Schottky contact with the p-type clad layer 13b, such as Au.

The dielectric layer 25 is made of, e.g., $SiO_2$ and provided in the surface layer of the light reflecting layer 20b. The dielectric layer 25 has annular portions around the outer edges of the opposite electrodes 22b and linear portions extending directly under, and along, the ohmic electrode 43b on the light-extraction-surface side. The dielectric layer 25 divides the ohmic electrode 21b on the light-reflecting-surface side into a plurality of portions at the surface in contact with the semiconductor film 10b and separates the opposite electrodes 22b from the portions of the ohmic electrode 21b.

Note that the portions of the ohmic electrode 21b and the opposite electrodes 22b are connected to each other under the dielectric layer 25.

The opposite electrodes 22b are placed directly under the feed pads 41b. The opposite electrode 22b has the same size and the same shape as the feed pad 41b. The opposite electrode 22b is separated by the annular portion of the dielectric layer 25 provided to surround the outer edge thereof from the portions of the ohmic electrode 21b at the surface in contact with the semiconductor film 10b.

The ohmic electrode 43b on the light-extraction-surface side and the portions of the ohmic electrode 21b on the light-reflecting-surface side are placed so as not to overlap each other when they are projected onto a projection plane parallel to the principal surface of the semiconductor film 10b, thus forming so-called counter-electrodes. That is, the ohmic electrode 21b on the light-reflecting-surface side is placed extending on both sides of, and along, the ohmic electrode 43b on the light-extraction-surface side, and the dielectric layer 25 is placed directly under the ohmic electrode 43b.

In FIG. 9B, paths of current flowing through the semiconductor film 10b at light emitting operation are indicated by solid-line arrows, and paths of current flowing through the semiconductor film 10b when a reverse surge voltage is applied are indicated by broken-line arrows. At light emitting operation, current flows from the portions of the ohmic electrode 21b on the light-reflecting-surface side in contact with the p-type clad layer 13b to the ohmic electrode 43b at the shortest distance from these on the light-extraction-surface side. Because both the electrodes form the counter-electrodes, the directions in which currents flow have a component of a principal surface direction (lateral direction) of the semiconductor film 10b, and hence the current spread inside the semiconductor film 10b having a relatively small thickness is promoted, thus making the current density distribution uniform. Meanwhile, since the feed pad 41b forms Schottky contact with the semiconductor film 10b, between them is formed a barrier of the opposite direction to that of the diode formed by the pn junction in the semiconductor film 10b (that is, a barrier acting to block the forward current). Hence, current does not flow to the feed pad 41b at light emitting operation. Further, since the opposite electrode 22b also forms Schottky contact with the semiconductor film 10b, between them is formed a barrier of the opposite direction to that of the diode formed by the pn junction in the semiconductor film 10b (that is, a barrier acting to block the forward current). Hence, almost no current flows out of the opposite electrode 22b. That is, at the time of light emitting operation, almost no current flows out of the opposite electrode 22b and flows into the feed pad 41b. Current exclusively flows between the ohmic electrode 43b on the light-extraction-surface side and the ohmic electrode 21b on the light-reflecting-surface side. By this means, it is possible to almost completely eliminate current flowing into the area immediately under the feed pad 41b at light emitting operation.

In contrast, when a reverse voltage is applied to the pn junction in the semiconductor film 10b, the Schottky junctions of the feed pad 41b and the opposite electrode 22b with the semiconductor film 10b are biased in a so-called forward direction, and hence current changing exponentially according to voltage flows. Thus, when a reverse surge voltage is applied, a current path of lower resistance is formed between the feed pad 41b and the opposite electrode 22b as compared with the current paths between the ohmic electrode 43b on the light-extraction-surface side and the ohmic electrode 21b on the light-reflecting-surface side. Further, when a reverse surge voltage is applied, current flows from the ohmic electrode 43b on the light-extraction-surface side to the ohmic electrode 21b on the light-reflecting-surface side. As such, when a reverse surge voltage is applied, a current path of remarkably lower resistance is formed between the feed pad 41b and the opposite electrode 22b than the current paths between the ohmic electrode 43b on the light-extraction-surface side and the ohmic electrode 21b on the light-reflecting-surface side. Hence, current constriction between the ohmic electrodes is alleviated, thus greatly improving the electrostatic-breakdown resistance.

In the semiconductor light emitting element 3 according to Embodiment 3, the semiconductor film 10b is constituted by a GaN-based semiconductor, and the resistance of the p-type clad layer 13b is relatively high. Hence, the area of the reflecting electrode connected to the p-type clad layer 13b is preferably larger than that of the semiconductor light emitting element according to Embodiment 1 including the semiconductor film constituted by an AlGaInP-based semiconductor. Accordingly, in the semiconductor light emitting element 3 according to Embodiment 3, the reflecting electrode is formed to cover most of the p-type clad layer 13b, thereby reducing the forward voltage VF. Also in the semiconductor light emitting element 3 having this electrode configuration, as in Embodiment 1, at light emitting operation, current flowing into the area immediately under the feed pad is prevented. In contrast, when a reverse surge voltage is applied, a current path of lower resistance is formed between the feed pad 41b and the opposite electrode 22b than the current paths between the ohmic electrode 43b on the light-extraction-surface side and the ohmic electrode 21b on the light-reflecting-surface side. Hence, with avoiding a reduction in the light extraction efficiency and a reduction in the light output at light emitting operation, it is possible to improve the breakdown resistance to reverse electrostatic surges.

Embodiment 4

Figure 10A:
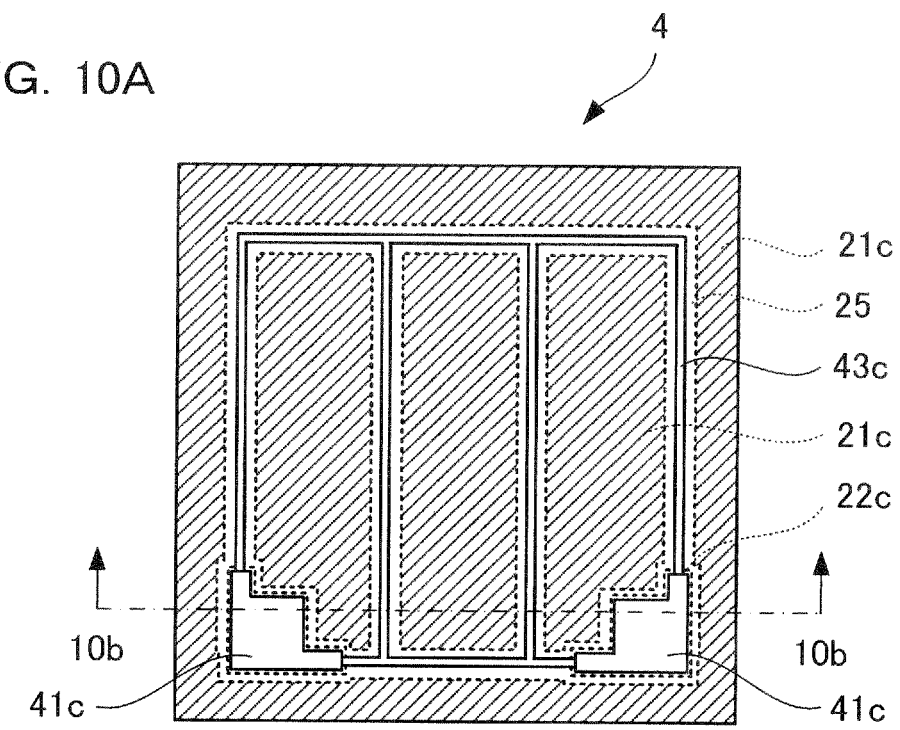
FIG. 10A is a plan view showing the configuration of a semiconductor light emitting element according to Embodiment 4 of the present invention.
Figure 10B:
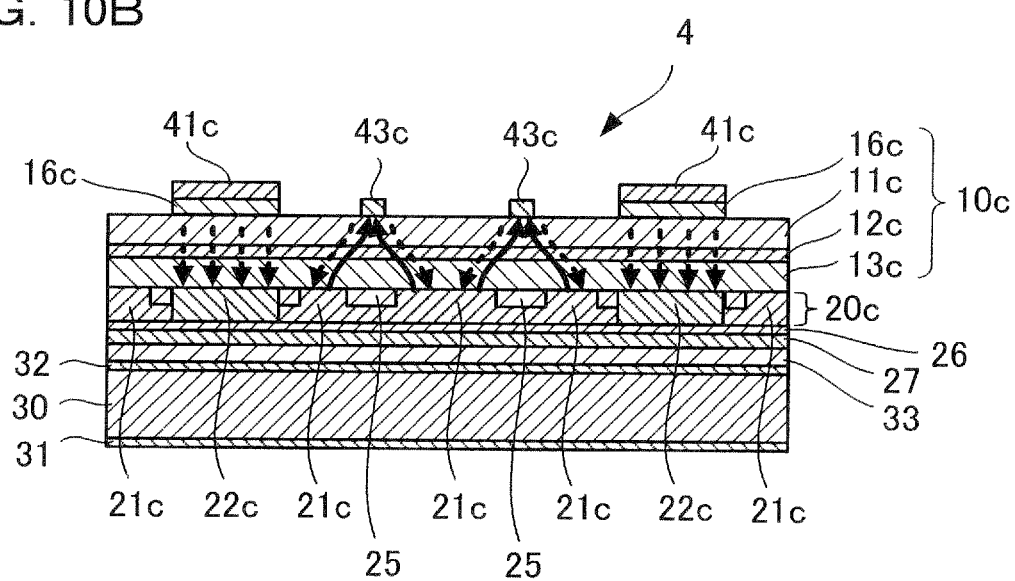
FIG. 10B is a cross-sectional view taken along line 10b-10b in FIG. 10A.

FIG. 10A is a plan view showing the configuration of a semiconductor light emitting element 4 according to Embodiment 4 of the present invention, and FIG. 10B is a cross-sectional view taken along line 10b-10b in FIG. 10A. In FIG. 10A, a surface electrode provided on the light-extraction-surface side is indicated by solid lines, and a reflecting electrode provided on the light-reflecting-surface side is indicated by broken lines and hatching.

In the semiconductor light emitting element 4, the semiconductor film 10c is constituted by a GaN-based semiconductor and configured with a damaged layer 16c, an n-type clad layer 11c, a light emitting layer 12c, and a p-type clad layer 13c that are laid one over another in that order from the light-extraction-surface side.

The damaged layer 16c is constituted by, e.g., GaN of 1 μm thickness. The damaged layer 16c is a layer which is higher in inner defect density than the other layers and thus is of high resistance. The damaged layer 16c can be formed by giving physical impact to a surface of a semiconductor film by surface processing such as a plasma process or a dry etching process. Or in the light emitting element including a GaN-based semiconductor film as in this embodiment, the surface of the semiconductor film exposed by removing the growth substrate by a laser lift-off method can be used as a damaged layer. The damaged layer 16c is formed so as to partially cover the n-type clad layer 11c. That is, in the semiconductor film 10c, the damaged layer 16c and the n-type clad layer 11c are exposed on the light-extraction-surface side. The n-type clad layer 11c is formed of, e.g., Si-doped GaN of 5 μm thickness. The n-type clad layer 11c has enough carrier concentration to form ohmic contact with the surface electrode (for example, a carrier concentration of $1 \times 10^{19}$ cm$^{-3}$). The light emitting layer 12c has a multi-quantum well structure configured with, e.g., pairs of a well layer of $In_{0.35}Ga_{0.65}N$ of 2 nm thickness and a barrier layer of GaN of 14 nm thickness that are laid one over another 5 times. The p-type clad layer 13c is formed of, e.g., a layer of Mg-doped $Al_{0.2}Ga_{0.8}N$ of 40 nm thickness and a layer of Mg-doped GaN of 100 nm thickness that are laid one over the other. Note that the composition ratio and thickness of each layer is not limited to the above but can be changed as needed.

An ohmic electrode (first electrode pieces) 43c and feed pads (bonding pads; second electrode pieces) 41c on the light-extraction-surface side can be made of the same material. These electrode are formed of, e.g., Ti (1 nm thickness) that is a candidate material for ohmic electrodes and Al (200 nm thickness)/Au (1000 nm thickness) on the Ti that are laid one over another in that order. The ohmic electrode 43c is formed on part of the n-type clad layer 11c exposed by partially removing the damaged layer 16c and forms ohmic contact with the n-type clad layer 11c. The feed pads 41c are formed on the damaged layer 16c and form Schottky contact with the damaged layer 16c. The feed pads 41c are respectively placed near two corners at opposite ends of one side of the semiconductor light emitting element 4. The ohmic electrode 43c is connected to the feed pads 41c and in the shape of a line extending over the surface of the n-type clad layer 11c to supply current throughout the semiconductor film 10c.

The light reflecting layer 20c provided adjacent to the p-type clad layer 13c comprises a dielectric layer 25 and a reflecting electrode and forms a light reflecting surface at the surface in contact with the semiconductor film 10c. The reflecting electrode is formed of an ohmic electrode (third electrode pieces) 21c on the light-reflecting-surface side, which, together with the ohmic electrode 43c on the light-extraction-surface side, forms counter-electrodes, and opposite electrodes (fourth electrode pieces) 22c respectively opposite to the two feed pads 41c. The ohmic electrode 21c is made of material which forms ohmic contact with the p-type clad layer 13c, such as Pt. The opposite electrodes 22c is made of material which forms Schottky contact with the p-type clad layer 13c, such as Au.

The dielectric layer 25 is made of, e.g., SiO$_2$ and provided in the surface layer of the light reflecting layer 20c. The dielectric layer 25 has annular portions around the outer edges of the opposite electrodes 22c and linear portions extending directly under, and along, the ohmic electrode 43c on the light-extraction-surface side. The dielectric layer 25 divides the ohmic electrode 21c on the light-reflecting-surface side into a plurality of portions at the surface in contact with the semiconductor film 10c and separates the opposite electrodes 22c from the portions of the ohmic electrode 21c. Note that the portions of the ohmic electrode 21c and the opposite electrodes 22c are connected to each other under the dielectric layer 25.

The opposite electrodes 22c are placed directly under the feed pads 41c. The opposite electrode 22c has the same size and the same shape as the feed pad 41c. The opposite electrode 22c is separated by the annular portion of the dielectric layer 25 provided to surround the outer edge thereof from the portions of the ohmic electrode 21c at the surface in contact with the semiconductor film 10c.

The ohmic electrode 43c on the light-extraction-surface side and the portions of the ohmic electrode 21c on the light-reflecting-surface side are placed so as not to overlap each other when they are projected onto a projection plane parallel to the principal surface of the semiconductor film 10c, thus forming so-called counter-electrodes. That is, the ohmic electrode 21c on the light-reflecting-surface side is placed extending on both sides of, and along, the ohmic electrode 43c on the light-extraction-surface side, and a portion of the dielectric layer 25 is placed directly under the ohmic electrode 43c.

In FIG. 10B, paths of current flowing through the semiconductor film 10c at light emitting operation are indicated by solid-line arrows, and paths of current flowing through the semiconductor film 10c when a reverse surge voltage is applied are indicated by broken-line arrows. At light emitting operation, current flows from the portions of the ohmic electrode 21c on the light-reflecting-surface side in contact with the p-type clad layer 13c to the ohmic electrode 43b at the shortest distance from these on the light-extraction-surface side. Because both the electrodes form the counter-electrodes, the directions in which currents flow have a component of a principal surface direction (lateral direction) of the semiconductor film 10c, and hence the current spread inside the semiconductor film 10c having a relatively small thickness is promoted, thus making the current density distribution uniform. Meanwhile, since the feed pad 41c provided on the damaged layer 16c forms Schottky contact with the semiconductor film 10c, between them is formed a barrier of the opposite direction to that of the diode formed by the pn junction in the semiconductor film 10c (that is, a barrier acting to block the forward current). Hence, current does not flow to the feed pad 41c at light emitting operation. Further, since the opposite electrode 22c also forms Schottky contact with the semiconductor film 10c, between them is formed a barrier of the opposite direction to that of the diode formed by the pn junction in the semiconductor film 10c (that is, a barrier acting to block the forward current). Hence, almost no current flows out of the opposite electrode 22c. That is, at the time of light emitting operation, almost no current flows out of the opposite electrode 22c and flows into the feed pad 41c. Current exclusively flows between the ohmic electrode 43c on the light-extraction-surface side and the ohmic electrode 21c on the light-reflecting-surface side. By this means, it is possible to almost completely eliminate current flowing into the area immediately under the feed pad 41c at light emitting operation.

In contrast, when a reverse voltage is applied to the pn junction in the semiconductor film 10c, the Schottky junctions of the feed pad 41c and the opposite electrode 22c with the semiconductor film 10c are biased in a so-called forward direction, and hence current changing exponentially according to voltage flows. Thus, when a reverse surge voltage is applied, a current path of lower resistance is formed between the feed pad 41c and the opposite electrode 22c as compared with the current paths between the ohmic electrode 43c on the light-extraction-surface side and the ohmic electrode 21c on the light-reflecting-surface side. Further, when a reverse surge voltage is applied, current flows from the ohmic electrode 43c on the light-extraction-surface side to the ohmic electrode 21c on the light-reflecting-surface side. As such, when a reverse surge voltage is applied, a current path of remarkably lower resistance is formed between the feed pad 41c and the opposite electrode 22c than the current paths between the ohmic electrode 43c on the light-extraction-surface side and the ohmic electrode 21c on the light-reflecting-surface side. Hence, current constriction between the ohmic electrodes is alleviated, thus greatly improving the electrostatic-breakdown resistance.

Also in the semiconductor light emitting element 4 according to the present embodiment, as in Embodiment 1, at light emitting operation, current flowing into the area immediately under the feed pad is prevented. In contrast, when a reverse surge voltage is applied, a current path of lower resistance is formed between the feed pad 41c and the opposite electrode 22c than the current paths between the ohmic electrode 43c on the light-extraction-surface side and the ohmic electrode 21c on the light-reflecting-surface side. Hence, with avoiding a reduction in the light extraction efficiency and a reduction in the light output at light emitting operation, it is possible to improve the breakdown resistance to reverse electrostatic surges.

The semiconductor light emitting element 4 can be manufactured by, e.g., the process as follows. The n-type clad layer 11c, the light emitting layer 12c, and the p-type clad layer 13c are formed sequentially over a sapphire substrate that is a growth substrate by the MOCVD method or the like. The composition and carrier concentration of each layer are as mentioned above. Then, $SiO_2$ constituting the dielectric layer 25 is formed and patterned. Then, a resist mask having openings at the regions where to form the opposite electrodes 22c, is formed over the dielectric layer 25. Subsequently, Au is deposited via the resist mask and the patterned dielectric layer 25 over the p-type clad layer 13c by an EB evaporation method or the like to form the opposite electrodes 22c. After the resist mask is removed, Pt is deposited via the patterned dielectric layer 25 to form the ohmic electrode 21c on the light-reflecting-surface side. Then, a support substrate is bonded via a plurality of metal layers onto the light reflecting layer 20c by the same process as in the above embodiment 1. Next, the sapphire substrate that is the growth substrate is removed by a laser lift-off method to make the semiconductor film exposed. The damaged layer 16c higher in defect density than the other layers and thus of high resistance is formed on the surface of the semiconductor film exposed by removing the sapphire substrate. Next, the damaged layer 16c is removed except its parts on which to form the feed pads 41c to make the n-type clad layer 11c exposed. Then, after Ti (1 nm thickness), Al (200 nm thickness), and Au (1000 nm thickness) are laid one over another in that order over the surfaces of the damaged layer 16c and the n-type clad layer 11c by an EB evaporation method or the like, this layer is patterned to form the surface electrode. The ohmic electrode 43c is formed on the n-type clad layer 11c exposed by removing the damaged layer 16c. The feed pads 41c are formed on the remaining damaged layer 16c. By undergoing the above processes, the semiconductor light emitting element 4 is finished.

The above embodiment illustrates the case where the surface of the semiconductor film exposed by removing the sapphire substrate is used as the damaged layer 16c, but is not limited to this. For example, the damaged layer may be formed by irradiating plasma onto a semiconductor film to give physical impact to the semiconductor film. Although in the above embodiment the damaged layer 16c is formed on the n-type clad layer 11c, the damaged layer may be formed in part of the n-type clad layer 11c. This structure can be formed by using a mask to limit the plasma irradiated area during the plasma irradiating process for forming a damaged layer. Although in the above embodiment the damaged layer is placed on the light-extraction-surface side, the damaged layer may be placed on the light-reflecting-surface side.

Embodiment 5

Figure 11A:
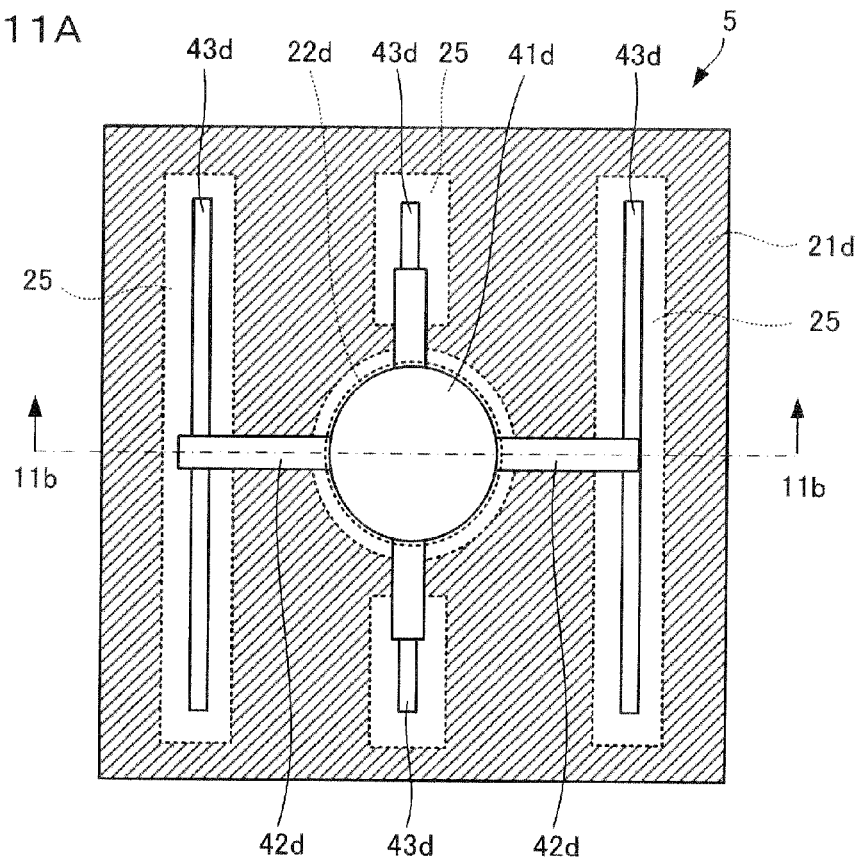
FIG. 11A is a plan view showing the configuration of a semiconductor light emitting element according to Embodiment 5 of the present invention.
Figure 11B:
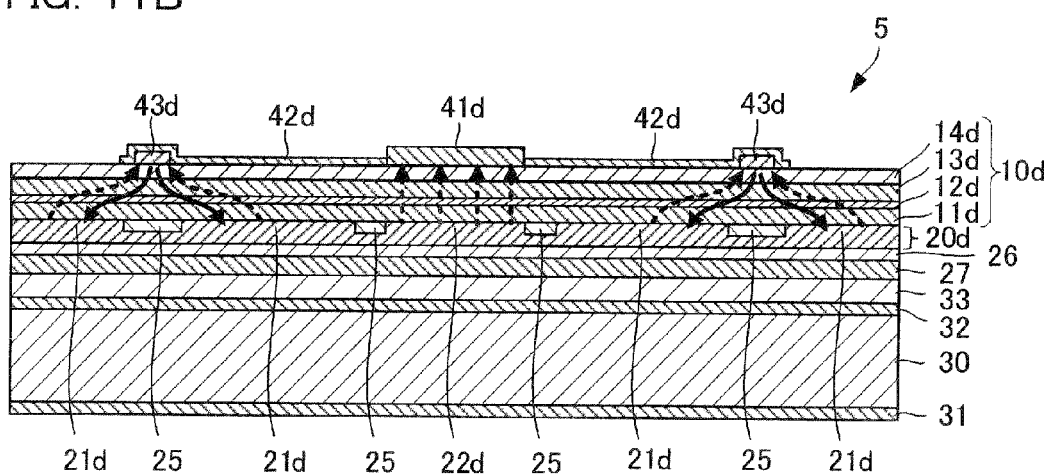
FIG. 11B is a cross-sectional view taken along line 11b-11b in FIG. 11A.

FIG. 11A is a plan view showing the configuration of a semiconductor light emitting element 5 according to Embodiment 5 of the present invention, and FIG. 11B is a cross-sectional view taken along line 11b-11b in FIG. 11A. In FIG. 11A, a surface electrode provided on the light-extractionsurface side is indicated by solid lines, and a reflecting electrode provided on the light-reflecting-surface side is indicated by broken lines and hatching. The semiconductor light emitting element 5 differs from the semiconductor light emitting element 1 according to Embodiment 1 in that p-type semiconductor layers are disposed mainly on the light-extraction-surface side of the semiconductor film 10d and that n-type semiconductor layers are disposed on the light-reflecting-surface side.

The semiconductor film 10d is constituted by an AlGaInP-based material and configured with a p-type contact layer 14d, a p-type clad layer 13d, a light emitting layer 12d, and an n-type clad layer 11d that are laid one over another in that order from the light-extraction-surface side. The composition of each layer is the same as in the semiconductor film according to the above embodiment 1.

On the surface of the p-type contact layer 14d that is the light extraction surface, there is provided a surface electrode formed of ohmic electrodes (first electrode pieces) 43d on the light-extraction-surface side, which form ohmic contact with the semiconductor film 10d; a feed pad (bonding pad; a second electrode piece) 41d to be connected by a bonding wire; and line electrodes 42d for electrically connecting the feed pad 41d and the ohmic electrodes 43d. The feed pad 41d and the line electrodes 42d are made of material which forms Schottky contact with the p-type clad layer 13d, such as Ta, Ti, W, Pt, WSi, or Cu. The feed pad 41d is placed in the center of the principal surface of the semiconductor film 10d and has a circular shape. The line electrodes 42d are linear electrodes extending from the feed pad 41d toward the four sides of the semiconductor film 10d and connecting to the ohmic electrodes 43d. The ohmic electrodes 43d are made of material which forms ohmic contact with the p-type contact layer 14d, such as AuZn. The ohmic electrodes 43d are in the shape of a line extending over the surface of the p-type contact layer 14d to supply current throughout the semiconductor film 10d.

The light reflecting layer 20d provided adjacent to the n-type clad layer 11d includes a dielectric layer 25 and a reflecting electrode and forms a light reflecting surface at the surface in contact with the semiconductor film 10d. The reflecting electrode is formed of ohmic electrodes (third electrode pieces) 21d on the light-reflecting-surface side, which, together with the ohmic electrodes 43d on the light-extraction-surface side, form the counter-electrodes, and an opposite electrode 22d (fourth electrode pieces) opposite to the feed pad 41d. The ohmic electrodes 21d are made of material which forms ohmic contact with the n-type clad layer 11d, such as AuGeNi. In contrast, the opposite electrode 22d is made of material which forms Schottky contact with the n-type clad layer 11d, such as Au, Al, Ag, Cu, Fe, Ni, Pd, Pt, Mo, Ta, Ti, W, or a nitride thereof (e.g., TaN or WN) or a silicide thereof (e.g., WSi or TaSi). The dielectric layer 25 is made of, e.g., $SiO_2$ and provided in the surface layer of the light reflecting layer 20d. The dielectric layer 25 has an annular portion around the outer edge of the opposite electrode 22d and linear portions extending directly under, and along, the ohmic electrodes 43d on the light-extraction-surface side. The dielectric layer 25 separates the ohmic electrodes 21d and the opposite electrode 22d at the surface in contact with the semiconductor film 10d. Note that the ohmic electrodes 21d and the opposite electrode 22d are connected to each other under the dielectric layer 25.

The opposite electrode 22d is placed directly under the feed pad 41d on the light-extraction-surface side. The opposite electrode 22 has, e.g., the same shape and the same size as the feed pad 41d. The opposite electrode 22d is separated by the annular portion of the dielectric layer 25 provided around its outer edge from the ohmic electrodes 21d at the surface in contact with the semiconductor film 10d.

The ohmic electrodes 43d on the light-extraction-surface side and the ohmic electrodes 21d on the light-reflecting-surface side are placed so as not to overlap each other when they are projected onto a projection plane parallel to the principal surface of the semiconductor film 10d, thus forming so-called counter-electrodes. That is, the ohmic electrodes 21d on the light-reflecting-surface side are placed on both sides of one of the ohmic electrodes 43d on the light-extraction-surface side, and a portion of the dielectric layer 25 is placed directly under the ohmic electrode 43d.

In FIG. 11B, paths of current flowing through the semiconductor film 10d at light emitting operation are indicated by solid-line arrows, and paths of current flowing through the semiconductor film 10d when a reverse surge voltage is applied are indicated by broken-line arrows. At light emitting operation, current flows from the ohmic electrodes 43d on the light-extraction-surface side in contact with the p-type clad layer 13d to the ohmic electrodes 21d on the light-reflecting-surface side. Because both the electrodes form the counter-electrodes, the directions in which currents flow have a component of a principal surface direction (lateral direction) of the semiconductor film 10d, and hence the current spread inside the semiconductor film 10d having a relatively small thickness is promoted, thus making the current density distribution uniform. Meanwhile, since the feed pad 41d forms Schottky contact with the semiconductor film 10d, between them is formed a barrier of the opposite direction to that of the diode formed by the pn junction in the semiconductor film 10d (that is, a barrier acting to block the forward current). Hence, current does not flow to the feed pad 41d at light emitting operation. Further, since the opposite electrode 22d also forms Schottky contact with the semiconductor film 10d, between them is formed a barrier of the opposite direction to that of the diode formed by the pn junction in the semiconductor film 10d (that is, a barrier acting to block the forward current). Hence, almost no current flows out of the opposite electrode 22d. That is, at the time of light emitting operation, almost no current flows out of the opposite electrode 22d and flows into the feed pad 41d. Current exclusively flows between the ohmic electrodes 43d on the light-extraction-surface side and the ohmic electrodes 21d on the light-reflecting-surface side. By this means, it is possible to almost completely eliminate current flowing into the area immediately under the feed pad 41d at light emitting operation.

In contrast, when a reverse surge voltage is applied to the pn junction in the semiconductor film 10d, the Schottky junctions of the feed pad 41d and the opposite electrode 22d with the semiconductor film 10d are biased in a so-called forward direction, and hence current changing exponentially according to voltage flows. Thus, when a reverse surge voltage is applied, a current path of lower resistance is formed between the feed pad 41d and the opposite electrode 22d as compared with the current paths between the ohmic electrodes 43d on the light-extraction-surface side and the ohmic electrodes 21d on the light-reflecting-surface side. Further, when a reverse surge voltage is applied, current flows from the ohmic electrodes 21d on the light-reflecting-surface side to the ohmic electrodes 43d on the light-extraction-surface side. As such, when a reverse surge voltage is applied, a current path of lower resistance is formed between the feed pad 41d and the opposite electrode 22d than the current paths between the ohmic electrodes 43d on the light-extraction-surface side and the ohmic electrodes 21d on the light-reflecting-surface side.

Hence, current constriction between the ohmic electrodes is alleviated, thus greatly improving the electrostatic-breakdown resistance.

The covering rate of the surface electrode provided on the light extraction surface of the semiconductor film cannot be increased too much, from the viewpoint of securing the light extraction efficiency. Meanwhile, with an AlGaInP-based semiconductor, it is generally difficult to form a structure where the resistance of the n-type semiconductor is reduced for current spread. This is because on the p-side, lattice mismatched GaP of low resistivity can be laid subsequent to p-type AlGaInP to reduce the resistance of the p-side, whereas on the n-side, generally an n-type layer is first laid on an n-type GaAs substrate and hence lattice mismatched GaP of low resistivity cannot be used. Although the resistance can be reduced by increasing the film thickness, this is not preferable because the crystallinity of MQW and a p-type semiconductor layer laid one over another is worsened. Hence, if the n-type clad layer is placed on the light-extraction-surface side, the surface electrode of a small area is formed on the n-type clad layer, and thus it is difficult to diffuse current sufficiently. As in the present embodiment, by placing the n-type clad layer on the light-reflecting-surface side, most of the surface of the n-type clad layer can be covered by the reflecting electrode, thus promoting current spread in the semiconductor film. Also in the semiconductor light emitting element 5 according to Embodiment 5 having this configuration, as in Embodiment 1, at light emitting operation, current flowing into the area immediately under the feed pad is prevented, whereas, when a reverse surge voltage is applied, a current path of lower resistance is formed between the feed pad 41d and the opposite electrode 22d than the current paths between the ohmic electrodes 43d on the light-extraction-surface side and the ohmic electrodes 21d on the light-reflecting-surface side. Hence, with avoiding a reduction in the light extraction efficiency and a reduction in the light output at light emitting operation, it is possible to improve the breakdown resistance to reverse electrostatic surges.

The semiconductor light emitting element 5 having the above configuration can be manufactured by, e.g., the process as follows. A semiconductor film 10d is formed over a growth substrate such as a GaAs substrate by the MOCVD method or the like. The semiconductor film 10d is formed of an n-type clad layer 11d, a light emitting layer 12d, a p-type clad layer 13d, and a p-type contact layer 14d laid one over another in that order over the growth substrate. Then, a temporary substrate of Si, glass, or the like is bonded by resin adhesive to the surface of the p-type contact layer 14d. Then, by removing the growth substrate, the n-type clad layer 11d is made exposed. Then, after a SiO$_2$ film to form part of the light reflecting layer 20d is formed over the n-type clad layer 11d and patterned, ITO and Au films are formed on the SiO$_2$ film to form the reflecting electrode. Although the reflecting electrode can be formed of AuGeNi, AuSn, or the like, in this case, the reflectance may decrease because an alloy layer is formed. Thus, the reflecting electrode is preferably formed of ITO, which does not form an alloy layer. Subsequently, a barrier metal layer and an adhering layer are formed over the light reflecting layer, and a support substrate is bonded according to the same procedure as in Embodiment 1. Then, the temporary substrate is removed to make the surface of the p-type contact layer 14d exposed. Then, after the ohmic electrodes 43d on the light-extraction-surface side are formed on the surface of the p-type contact layer 14d, the feed pad 41d and the line electrodes 42d are formed.

In the above embodiments, a surge current path which functions (becomes conductive) only when a reverse voltage is applied, is placed immediately under the feed pad, but this current path may be placed in a single or multiple regions other than the region immediately under the feed pad. That is, pairs of electrodes which are on opposite sides of the semiconductor film and both form Schottky contact with the semiconductor film may be placed on the semiconductor film in a distributed manner. Further, semiconductor light emitting elements can be configured by replacing mutually or combining as needed the electrode configurations and the configurations of the semiconductor film shown in the above embodiments.

This application is based on Japanese Patent Application No. 2011-173692 which is herein incorporated by reference.

What is claimed is:

1. A semiconductor light emitting element which includes a support substrate, a semiconductor film including a light emitting layer and provided over said support substrate, a surface electrode provided on the surface on a light-extraction-surface side of said semiconductor film, and a light reflecting layer provided between said support substrate and said semiconductor film, said light reflecting layer forming a light reflecting surface at the surface in contact with said semiconductor film,
    wherein said surface electrode includes first electrode pieces that form ohmic contact with said semiconductor film and a second electrode piece electrically connected to said first electrode pieces,
    wherein said light reflecting layer includes a reflecting electrode, and said reflecting electrode includes third electrode pieces that form ohmic contact with said semiconductor film and a fourth electrode piece electrically connected to said third electrode pieces and placed opposite to said second electrode piece,
    wherein said first electrode pieces and said third electrode pieces are placed so as not to overlap each other when they are projected onto a plane parallel to the principal surface of said semiconductor film, and
    wherein both said second electrode piece and said fourth electrode piece form Schottky contact with said semiconductor film so as to form barriers to prevent forward current in said semiconductor film.

2. A semiconductor light emitting element according to claim 1, wherein carrier concentrations of portions of said semiconductor film in contact with at least one of said second and fourth electrode pieces are lower than carrier concentrations of portions of said semiconductor film in contact with said first and third electrode pieces.

3. A semiconductor light emitting element according to claim 2, wherein said semiconductor film includes a high carrier concentration layer and a low carrier concentration layer, which differ in carrier concentration, on each of said light-extraction-surface side and the light-reflecting-surface side, on which said light reflecting surface is, of said light emitting layer,
    wherein said first electrode pieces are provided on said high carrier concentration layer on the light-extraction-surface side,
    wherein said second electrode piece is provided on said low carrier concentration layer on the light-extraction-surface side,
    wherein said third electrode pieces are provided on said high carrier concentration layer on the light-reflecting-surface side, and
    wherein said fourth electrode piece is provided on said low carrier concentration layer on the light-reflecting-surface side.

4. A semiconductor light emitting element according to claim 3, wherein said first electrode pieces and said second electrode piece are made of the same material, and said third electrode pieces and said fourth electrode piece are made of the same material.

5. A semiconductor light emitting element according to claim 4, wherein said second electrode piece is a feed pad.

6. A semiconductor light emitting element according to claim 3, wherein said second electrode piece is a feed pad.

7. A semiconductor light emitting element according to claim 2, wherein said first electrode pieces and said second electrode piece are made of the same material, and said third electrode pieces and said fourth electrode piece are made of the same material.

8. A semiconductor light emitting element according to claim 7, wherein said second electrode piece is a feed pad.

9. A semiconductor light emitting element according to claim 2, wherein said second electrode piece is a feed pad.

10. A semiconductor light emitting element according to claim 1, wherein said semiconductor film has a damaged layer of higher resistance than the other regions at its portions in contact with at least one of said second and fourth electrode pieces, said damaged layer being formed by mechanical impact on said semiconductor film.

11. A semiconductor light emitting element according to claim 10, wherein said damaged layer is higher in crystal defect density than the other layers.

12. A semiconductor light emitting element according to claim 11, wherein said first electrode pieces and said second electrode piece are made of the same material, and said third electrode pieces and said fourth electrode piece are made of the same material.

13. A semiconductor light emitting element according to claim 12, wherein said second electrode piece is a feed pad.

14. A semiconductor light emitting element according to claim 11, wherein said second electrode piece is a feed pad.

15. A semiconductor light emitting element according to claim 10, wherein said first electrode pieces and said second electrode piece are made of the same material, and said third electrode pieces and said fourth electrode piece are made of the same material.

16. A semiconductor light emitting element according to claim 15, wherein said second electrode piece is a feed pad.

17. A semiconductor light emitting element according to claim 10, wherein said second electrode piece is a feed pad.

18. A semiconductor light emitting element according to claim 1, wherein said second electrode piece is a feed pad.

* * * * *